(12) United States Patent
Yang et al.

(10) Patent No.: US 11,676,974 B2
(45) Date of Patent: Jun. 13, 2023

(54) DISTRIBUTED AND MULTI-GROUP PAD ARRANGEMENT

(71) Applicant: PARADE TECHNOLOGIES, LTD., San Jose, CA (US)

(72) Inventors: Yueh-Lin Yang, Zhubei (TW); Haijun Chen, Shanghai (CN); Tatao Hsu, Taipei (TW); Jonathan Huang, Taipei (TW)

(73) Assignee: PARADE TECHNOLOGIES, LTD., San Jose, CA (US)

( * ) Notice: Subject to any disclaimer, the term of this patent is extended or adjusted under 35 U.S.C. 154(b) by 0 days.

(21) Appl. No.: 17/488,263

(22) Filed: Sep. 28, 2021

(65) Prior Publication Data
US 2022/0384489 A1   Dec. 1, 2022

Related U.S. Application Data

(63) Continuation-in-part of application No. 17/334,370, filed on May 28, 2021.

(51) Int. Cl.
*H01L 27/12*   (2006.01)
*G02F 1/1345*   (2006.01)

(52) U.S. Cl.
CPC ........ *H01L 27/124* (2013.01); *G02F 1/13452* (2013.01); *G02F 1/13456* (2021.01); *G02F 1/13458* (2013.01)

(58) Field of Classification Search
CPC .............. H01L 27/124; G02F 1/13456; G02F 1/13452; G02F 1/13458
See application file for complete search history.

(56) References Cited

U.S. PATENT DOCUMENTS

| 2007/0002243 | A1 | 1/2007 | Kim | |
| 2011/0085122 | A1* | 4/2011 | Fu | G02F 1/13452 345/55 |
| 2019/0371691 | A1 | 12/2019 | Han et al. | |
| 2020/0103693 | A1* | 4/2020 | Chen | G02F 1/13452 |

OTHER PUBLICATIONS

Yang, Office Action, U.S. Appl. No. 17/334,370, dated Sep. 29, 2022, 10 pgs.

* cited by examiner

*Primary Examiner* — Afroza Chowdhury
(74) *Attorney, Agent, or Firm* — Morgan, Lewis & Bockius LLP

(57) ABSTRACT

An electronic device has a display substrate including a display area, a driver area, and a fan-out area. The fan-out area has interconnects providing electrical accesses to display elements of the display area. The device has a driver chip disposed on the driver area. The driver chip includes a first edge adjacent to the display area and multiple pad groups, each pad group including a respective row of electronic pads that is (i) arranged substantially in parallel with the first edge and (ii) electrically coupled to a respective subset of display elements via respective interconnects routed on a respective region of the fan-out area. The pad groups include a first pad group and a second pad group. The first and second pad groups have two different distances from the first edge and correspond to two different subsets of interconnects routed on two non-overlapping regions of the fan-out area.

20 Claims, 13 Drawing Sheets

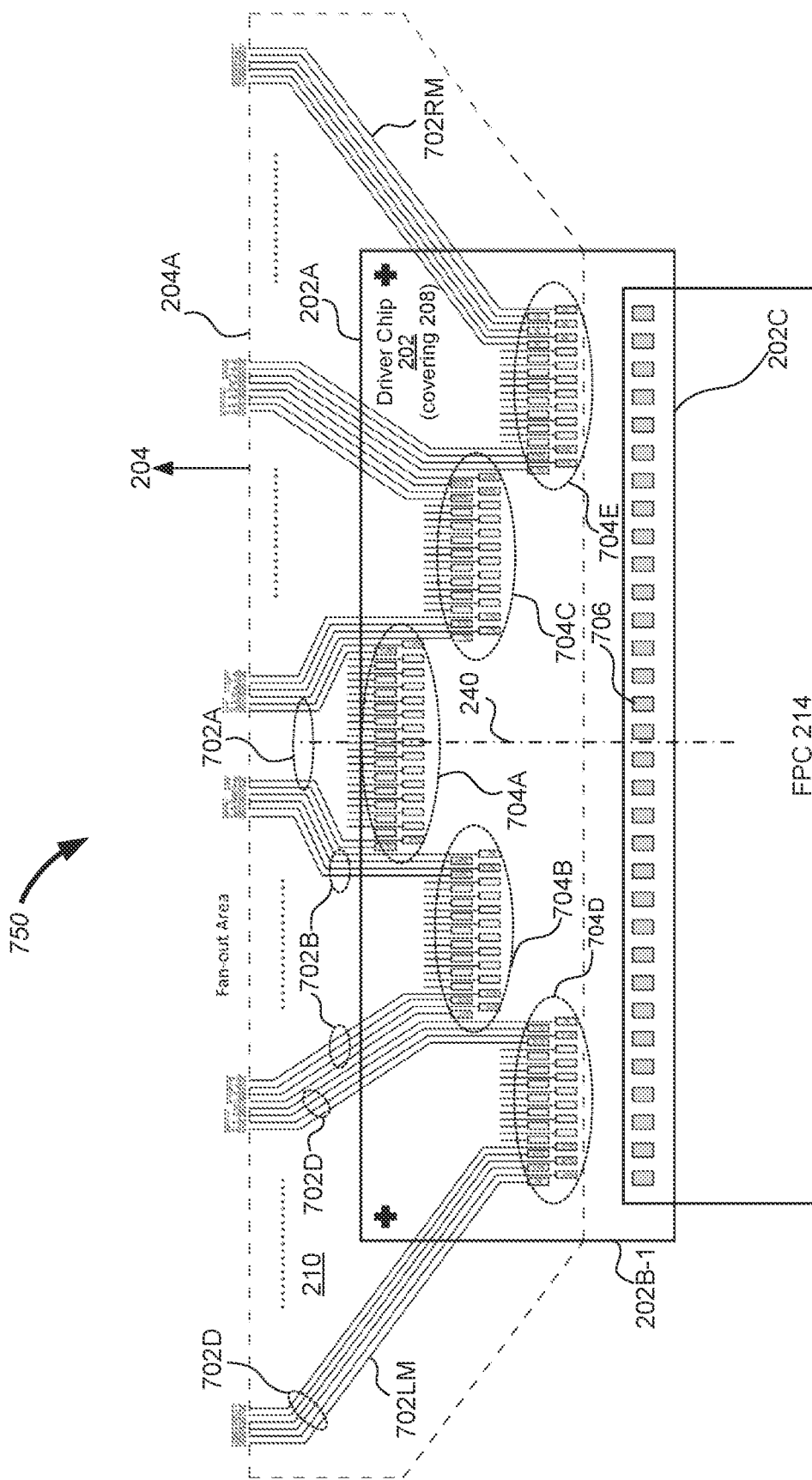

DISTRIBUTED AND MULTI-GROUP PAD ARRANGEMENT

RELATED APPLICATION

This application is a continuation-in-part of and claims priority to U.S. patent application Ser. No. 17/334,370, filed May 28, 2021, entitled "Pad Arrangement in Fan-Out Areas of Display Devices", which is incorporated by reference herein in its entirety.

TECHNICAL FIELD

The disclosed embodiments relate generally to display devices, including methods and systems for adaptively arranging routing interconnects within a fan-out area located in a bezel of a display screen.

BACKGROUND

Display screens are widely applied in today's industrial and consumer products (e.g., cellular phones, GPS devices, set-top boxes, cameras, computer screens, MP3 players, digital tablets, and the like). Some of these display screens are touch display screens that utilize capacitive sense arrays made of capacitive sense elements. In most of these display screens, display elements and capacitive sense elements are hard-wired to an edge area (i.e., a bezel) where the electrical circuit for driving the display elements and detecting touches on the capacitive sense array can be accessed. However, this arrangement is at odds with a technological trend to create a large display screen having a substantially narrow bezel in many state-of-the-art consumer electronics devices (e.g., a bezel-less mobile phone or a laptop having an extremely narrow screen edge). When the resolution of a display screen is substantially large (e.g., 3840×1760 pixels), a relatively large number of hard wires need to extend from the display area and access a relatively small edge of the electrical circuit within a fan-out area of the bezel of the display screen. Despite the technological trend towards a substantially narrow bezel, the display and capacitive sense elements' need to access the electrical circuit creates a challenge to keep a substantially small bezel width or fan-out area height for the display screen.

SUMMARY

Various embodiments of systems, methods and devices within the scope of the appended claims each have several aspects, no single one of which is solely responsible for the attributes described herein. After considering this disclosure, one will understand how the aspects of various embodiments are used to adaptively arrange routing interconnects of display elements and/or capacitive sense elements in a fan-out area located in a bezel of a display screen to reduce a height of the fan-out area (e.g., below a threshold fan-out height).

In some embodiments, an electronic device includes a display screen and a driver chip. The display screen has a display area, a driver area, and a fan-out area, and the driver chip is disposed on the driver area of the display screen. The fan-out area has a plurality of interconnects configured to provide electrical accesses to a plurality of display elements of the display area. The driver chip further includes a first edge placed adjacent to the display area, one or more second edges distinct from the first edge, and a first row of electronic pads proximate to the first edge. The first row of electronic pads has a first subset of end pads at a first end of the first row, a second subset of end pads at a second opposite end of the first row, and a first subset of intermediate pads located between the first subset of end pads and the second subset of end pads. The first subset of end pads physically contact a first subset of interconnects from the first edge, and the first subset of intermediate pads physically contact a second subset of interconnects from the one or more second edges.

In some embodiments, the plurality of interconnects are formed on a single layer of conductive material, cannot cross each other, and are spatially ordered on the display screen.

In some embodiments, the fan-out area at least partially surrounds the driver area, and the one or more second edges include two side edges connecting to the first edge. Further, in some embodiments, the second subset of interconnects include a first number of interconnects. The first number is determined based on a length of the two side edges connecting to the first edge. The plurality of interconnects include a remaining number of interconnects that physically access the first row of electronic pads from the first edge. The height of the fan-out area is configured to accommodate the remaining number of interconnects that are routed from the display area to the first row of electronic pads via the first edge.

In some embodiments, the second subset of end pads physically contact a corresponding subset of interconnects from the first edge. Further, in some embodiments, the first subset of end pads include more than one pad that are located at the first end of the first row, and the second subset of end pads include more than one pad that are located at the second opposite end of the first row.

In some embodiments, the first row of electronic pads further include a second subset of intermediate pads. The first subset of intermediate pads are located between the second subset of intermediate pads and the first subset of end pads, and the second subset of intermediate pads physically contact a third subset of interconnects from the first edge. Further, in some embodiments, each of the third subset of interconnects at least partially has a respective serpentine shape and has a respective length that matches that of the first subset of interconnects.

In some embodiments, each of the first subset of interconnects at least partially has a respective serpentine shape and has a respective length that matches that of the second subset of interconnects.

In some embodiments, the driver chip includes an interconnect compensation component configured to generate electrical signals that compensate for parasitics (e.g., parasitic resistance) of one or more interconnects of the plurality of interconnects actively.

In some embodiments, the first row of electronic pads further include a plurality of adjacent subsets of intermediate pads that are located between the first subset of end pads and the second subset of end pads and spatially ordered in the first row. The plurality of adjacent subsets of intermediate pads contact respective subsets of interconnects alternatingly from a respective second edge and from the first edge.

In some embodiments, the driver chip further includes a second row of electronic pads proximate to the first edge and the first row of electronic pads. The second row of electronic pads include a third subset of end pads at a third end of the second row, a fourth subset of end pads at a fourth end of the second row, and a second subset of intermediate pads located between the third subset of end pads and the fourth subset of end pads. The third subset of end pads physically contact a third subset of interconnects from the first edge, and the second subset of intermediate pads physically contact a fourth subset of interconnects from the one or more second edges. Further, in some embodiments, the first subset of interconnects and third subset of interconnects interleave with each other, and the second subset of interconnects and fourth subset of interconnects interleave with each other. Additionally, in some embodiments, the driver chip further includes one or more third rows of electronic pads proximate to the first edge and the second row of electronic pads. Each of the one or more third rows of electronic pads include a fifth subset of end pads at a fifth end of the respective third row, a sixth subset of end pads at a sixth opposite end of the respective third row, and a third subset of intermediate pads located between the fifth subset of end pads and the sixth subset of end pads. The fifth subset of end pads physically contacts a fifth subset of interconnects from the first edge.

In some embodiments, the one or more second edges distinct from the first edge include a bottom edge that opposes and is parallel to the first edge. The bottom edge includes a first portion and a second portion. The second subset of interconnects access the first subset of intermediate pads from the first portion. The second portion includes a plurality of input electronic pads and is adjacent to a fan-in area of the display screen.

In some embodiments, the first subset of end pads are arranged in a first order that is consistent with that of the first subset of intermediate pads and the first subset of interconnects, and the first subset of intermediate pads are arranged in a second order that is opposite to that of the second subset of interconnects.

In some embodiments, the driver chip is flip-chip assembled to the display screen, thereby facilitating the first subset of end pads and the first subset of intermediate pads to physically contact the first subset of interconnects and the second subset of interconnects, respectively.

In some embodiments, the electronic device is a laptop display, a tablet computer display, or a mobile phone display. The driver chip includes at least one source driver configured to drive the plurality of display elements and includes a timing controller configured to control driving of the plurality of display elements in a synchronous manner.

In some embodiments, the one or more second edges include a third edge that opposes the first edge. The display screen further includes a fan-in area disposed adjacent to the third edge. Flexible printed circuit (FPC) is disposed on the fan-in area to provide one or more input signals to the display chip.

In some embodiments, the driver area is a first driver area, and the display area is a first fan-out area. The display screen has a plurality of driver areas including the first driver area, and a plurality of fan-out areas including the first fan-out area. Each fan-out area has a plurality of respective interconnects configured to provide electrical accesses to a plurality of respective display elements of the display area. A plurality of driver chips are disposed on the plurality of driver areas. Among the plurality of driver chips, at least a first driver chip disposed on the first driver area is routed with outmost interconnects routed from one or more second edges of the first driver chip. In some embodiments, each and every driver chip is routed with respective outmost interconnects routed from the respective one or more second edges of the respective driver chip. By these means, the height of the fan-out area is reduced not only by using multiple driver chips, but also by routing a subset of the interconnects from the one or more second edges of the respective driver chip.

In another aspect, an electronic device has a display substrate and a drive chip. The display substrate includes a display area, a driver area, and a fan-out area. The fan-out area has a plurality of interconnects configured to provide electrical accesses to a plurality of display elements of the display area. The driver chip is disposed on the driver area of the display substrate, and further includes a first edge adjacent to the display area and a plurality of pad groups. Each pad group includes a respective row of electronic pads that is (i) arranged substantially in parallel with the first edge and (ii) electrically coupled to a respective subset of display elements via a respective subset of interconnects routed on a respective region of the fan-out area. The plurality of pad groups includes a first pad group and a second pad group, and the first and second pad groups have two different distances from the first edge and correspond to two different subsets of interconnects routed on two non-overlapping regions of the fan-out area.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIGS. 7A and 7B are two example bezel regions of a display screen in which interconnects extending from a display area contact a plurality of pad groups of a driver chip having different distances from the display area, in accordance with some embodiments.

Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, mechanical structures, circuits, and networks have not been described in detail so as not to unnecessarily obscure aspects of the embodiments.

This application introduces a new output pad sequence design to significantly reduce the fan-out area (specifically, the height of the fan-out area) to fit into a substantially narrow bezel of a display screen. The new output pad sequence design is incorporated on a driver chip that is disposed in proximity to the fan-out area and flip-chip coupled to wires formed on a display substrate of the display screen. The display substrate is optionally made of glass, and the driver chip is coupled to the display substrate via chip-on-glass (COG) bonding. Interconnects coupling display and/or capacitive sense elements to pads of the driver chip are adjusted according to the new output pad sequence design. For example, a subset of interconnects are routed to take a detour to access corresponding pads in the new output pad sequence design from side edges of the driver chip, rather than accessing the corresponding pads from a top edge of the driver chip directly. This addresses the challenge of routing all of the interconnects from the top edge, thereby reducing the height of the fan-out area and the width of a bezel area containing the fan-out area. Thinner bezels help maximize the screen real estate of a laptop and make multiple desktop displays look more like a single screen when placed side by side.

Figure 1A:
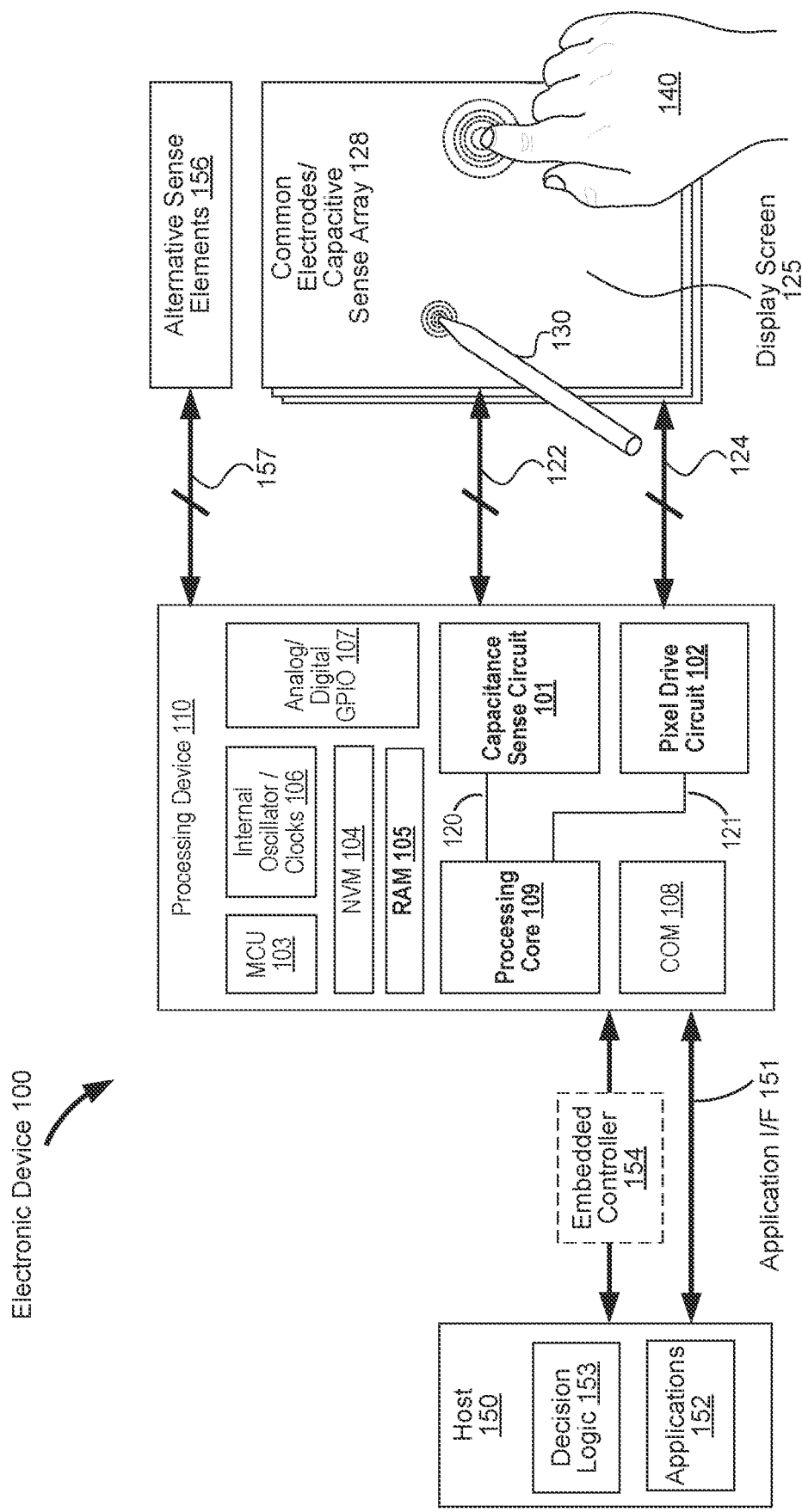
FIG. 1A is a block diagram illustrating an electronic device, in accordance with some embodiments.
Figure 1B:
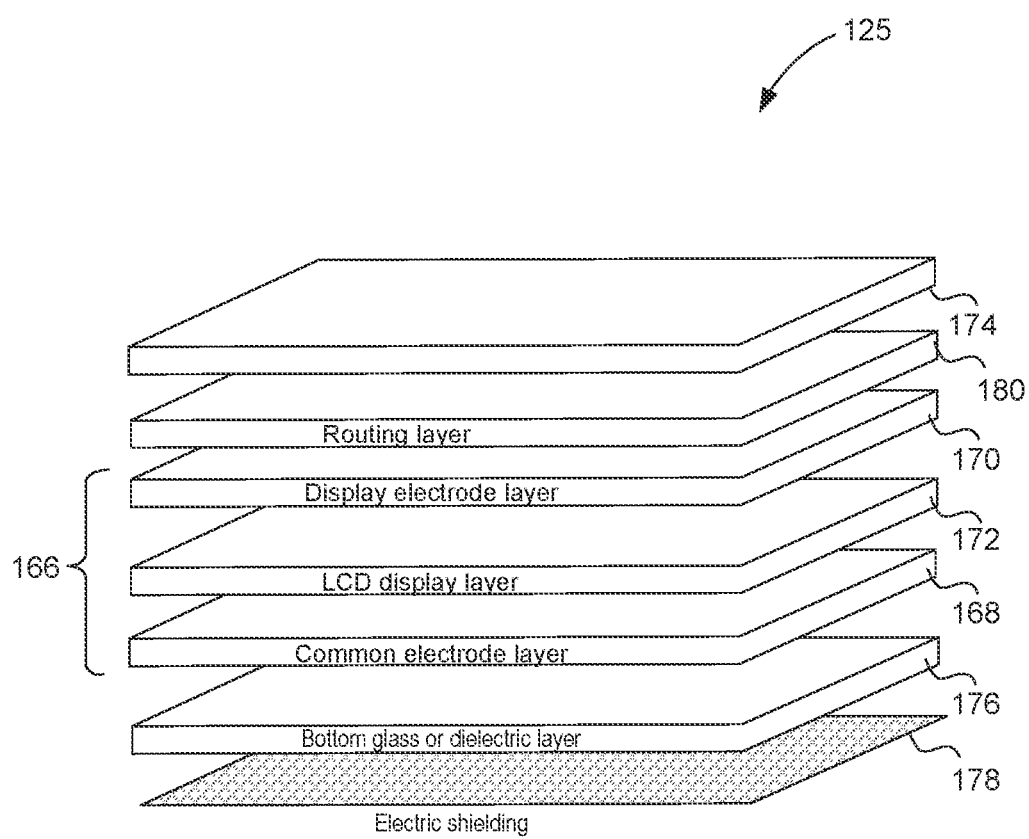
FIG. 1B is an exploded view of a display screen of the electronic device in FIG. 1A, including a plurality of structural layers, in accordance with some implementations.

FIG. 1A is a block diagram illustrating an electronic device 100, in accordance with some embodiments, and FIG. 1B is an exploded view of a display screen 125 of the electronic device in FIG. 1A, including a plurality of structural layers, in accordance with some implementations. The electronic device 100 includes a processing device 110 that is electrically coupled to the display screen 125 having a display pixel array. The display pixel array further includes a plurality of display elements driven between a plurality of display electrodes and one or more common electrodes. Each display element is disposed between a display electrode and a common electrode. In a display driving state, a voltage bias is generated by the processing device 110 and applied between the display and common electrodes of each display element to enable display of a color on the respective display element. In the depicted implementation, the display and/or common electrodes are electrically coupled to the processing device 110 via a bus 124, and configured to receive display driving signals (e.g., the voltage bias that enables display of the color on each display pixel) from the processing device 110 via the bus 124.

In some embodiments, the display screen 125 further includes a capacitive sense array 128 including a two-dimensional array of capacitive sense elements. Each capacitive sense element is formed by a respective intersection of (i) a respective row electrode in a first electrode layer and (ii) a respective column electrode in a second electrode layer. The processing device 110 operates in a touch sensing state in addition to a display driving state. In the touch sensing state, the processing device 110 is configured to measure capacitance variations at the row and column electrodes and detect one or more touches on or proximate to a surface of the display screen 125. In some embodiments, the processing device 110 alternates between the display driving state and the touch sensing state according to a predetermined duty cycle (e.g., 80%) for the display driving state, and detects a contact with or a proximity to a touch sensing surface associated with the display pixel array at a distinct duty cycle, thereby avoiding interfering with display operations of the display pixel array during the predetermined duty cycle. In some embodiments, the processing device 110 operates in the display driving state and the touch sensing state concurrently by two separate circuit blocks (e.g., a pixel drive circuit 102 and a capacitance sense circuit 101). These circuits implement display operations via the display pixel array and detect a contact with or a proximity to a touch sensing surface associated with the display pixel array. The capacitive sense array 128 is coupled to the processing device 110 via a bus 122, and the capacitive sense array 128 is configured to provide capacitive sense signals to the capacitance sense circuit 101 of the processing device 110 via the bus 122.

In some embodiments, the processing device 110 includes analog and/or digital general purpose input/output ("GPIO") ports 107. The GPIO ports 107 may be programmable. The GPIO ports 107 may be coupled to a Programmable Interconnect and Logic ("PIL"), which acts as an interconnect between the GPIO ports 107 and a digital block array of the processing device 110 (not shown). In some embodiments, the digital block array is configured to implement a variety of digital logic circuits (e.g., DACs, digital filters, or digital control systems) using configurable user modules ("UMs"). The digital block array may be coupled to a system bus. The processing device 110 may also include memory, such as random access memory ("RAM") 105 and non-volatile memory ("NVM") 104. The RAM 105 may be static RAM ("SRAM"). The non-volatile memory 104 may be flash memory, which may be used to store firmware (e.g., control algorithms executable by processing core 109 to implement operations described herein). The processing device 110 may also include a memory controller unit ("MCU") 103 coupled to the memory and the processing core 109. The processing core 109 is a processing element configured to execute instructions or perform operations stored in the memory for the purposes of driving the display pixel array or detecting touches on the touch sensing surface. It should also be noted that the memory may be internal to the processing device 110 or external to it.

Some or all of the operations of the processing core 109 may be implemented in firmware, hardware, software, or some combination thereof. The processing core 109 may provide display information to the pixel drive circuit 102, such that the pixel drive circuit 102 can be configured to drive individual display elements in the display screen 125 to display images or videos based on the display information. In some embodiments, the processing core 109 includes the pixel drive circuit 102. In some embodiments, the processing core 109 includes some or all functions of the pixel drive circuit 102 (e.g., part or all of the pixel drive circuit 102 is integrated into the processing core 109). Additionally, in some embodiments, the processing core 109 receives signals from the capacitance sense circuit 101, determine the state of the capacitive sense array 128 (e.g., determining whether an object is detected on or in proximity to the touch sensing surface), resolve where the object is on the sense array (e.g., determining the location of the object), track the motion of the object, or generate other information related to an object detected at the touch sensor. In some embodiments, the processing core 109 includes the capacitance sense circuit 101. In some embodiments, the processing core 109 performs some or all the functions of capacitance sense circuit 101.

In some embodiments, the processing core 109 generates a display driving enable signal 121 used to enable a display driving state (e.g., decouple the capacitance sense circuit 101 from the capacitive sense array 128 and couple the pixel drive circuit 102 to the common electrodes). In such a display driving state, the pixel drive circuit 102 enables a bias voltage and a reference voltage corresponding to an intended color on each display element of the display pixel array. The display element displays the intended color when the bias voltage and the reference voltage are applied on the display electrode and the common electrode of the respective display element. In some embodiments, the processing core 109 generates both a touch detection enable signal 120 and a display driving enable signal 121, which are synchronized to control the capacitance sensing circuit 101 and the pixel drive circuit 102 to detect touch locations and drive individual display elements, respectively. The touch detection enable signal 120 is used to enable a touch sensing state in which one or more touch locations are thereby detected if one or more objects touch the touch sensing surface of the electronic device 100. The touch detection enable signal 120 and the display driving enable signal 121 can be enabled sequentially and share operation time of electrodes that are shared by the display pixel array and the capacitive sense array.

The processing device 110 may include internal oscillator/clocks 106 and a communication block ("COM") 108. In some embodiments, the processing device 110 includes a spread-spectrum clock (not shown). The oscillator/clocks 106 provides clock signals to one or more of the components of processing device 110. The communication block 108 may be used to communicate with an external component, such as an application processor 150, via an application interface ("I/F") line 151. In some embodiments, the processing device 110 may also be coupled to an embedded controller 154 to communicate with the external components, such as a host 150. In some embodiments, the processing device 110 is configured to communicate with the embedded controller 154 or the host 150 to send and/or receive data. The host 150, as illustrated in FIG. 1A, may include decision logic 153 that performs some or all of the operations of the processing core 109. Operations of the decision logic 153 may be implemented in firmware, hardware, software, or a combination thereof. The host 150 may include a high-level Application Programming Interface (API) in the applications 152, which perform routines on the received data, such as compensating for sensitivity differences, other compensation algorithms, baseline update routines, start-up and/or initialization routines, interpolation operations, or scaling operations. The operations described with respect to the processing core 109 may be implemented in the decision logic 153, the applications 152, or in other hardware, software, and/or firmware external to the processing device 110. In some other embodiments, the processing device 110 includes the host 150. As such, instead of performing the operations of the processing core 109 locally, the processing device 110 may send the raw data or partially-processed data to the host 150 under some circumstances.

The processing device 110 may reside on a common carrier substrate such as an integrated circuit ("IC") die substrate, a multi-chip module substrate, or the like. In some embodiments, the components of the processing device 110 includes one or more separate integrated circuits and/or discrete components. In some embodiments, the processing device 110 includes one or more other processing devices known by those of ordinary skill in the art, such as a microprocessor or central processing unit, a controller, a special-purpose processor, a digital signal processor ("DSP"), an application specific integrated circuit ("ASIC"), a field programmable gate array ("FPGA"), or the like.

In some embodiments, the electronic device 100 is used in a tablet computer. In some embodiments, the electronic device 100 is used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, a global position system ("GPS"), or a control panel. In some embodiments, the electronic device 100 further includes one or more alternative sense elements 156 configured to communicate with the processing device 110 via a bus 157. Each alternative sense element 156 is optionally a capacitance based sensor or a non-capacitance sensor. Example alternative sense elements 156 include, but are not limited to, an ambient light sensor, a capacitive touch button, and a side touch sensor.

Referring to FIG. 1B, the plurality of structural layers of a display screen 125 include a display element assembly 166 that is protected by a top glass or dielectric layer 174. The display element assembly 166 includes a common electrode layer 168 and a display electrode layer 170, which are separated by an intermediate LCD display layer 172. The display electrode layer 170 and common electrode layer 168 are applied directly above and below the LCD display layer 172 to form display electrodes and common electrodes on which a voltage bias is applied to drive LCD display cells in the LCD display. In some implementations, the display screen 125 of the electronic device 100 further includes a bottom glass or dielectric layer 176 and/or an electric shielding 178, which are disposed under the display element assembly 166 to support the display pixel array mechanically and shield the display pixel array from electrical noises.

In some implementations not shown in FIG. 1B, a touch display screen 125 of the electronic device further includes a touch detection assembly having a first electrode layer, a second electrode layer, and a dielectric layer separating the first and second electrode layers. In the stack shown in FIG. 1B, the touch detection assembly is optionally placed under the display element assembly 166 or inserted between the top glass or dielectric layer 174 and the display element assembly 166. In some implementations, the first electrode layer, the second electrode layer, the display electrode layer 170, and the common electrode layer 168 are distinct from each other. In some implementations, one of the first and second electrode layers is used as the display electrode layer 170 or common electrode layer 168. For example, when the LCD display layer 172 is disposed below the touch detection assembly, the display electrode layer 170 is optionally used as the second electrode layer, and the row or column electrodes made from the second electrode layer may be reconfigured to the display electrodes of the display electrode layer 170 to drive the LCD display cells formed in the LCD display layer 172.

In some embodiments, the display screen 125 includes one or more additional routing layers 180 distinct from the display and common electrode layers applied in each display element. In a touch display screen 125, the one or more additional routing layers 180 are also distinct from the first and second electrode layers applied in each capacitive sense element. The one of more additional routing layers 180 are configured to provide the buses 122, 124, and/or 157 electrically coupling the processing device 110 to the display screen 125, thereby enabling display, touch sensing, and/or alternative sensing capabilities on the display screen 125. More details on the one or more additional routing layers 180 are discussed below with reference to FIGS. 2A-6.

Figure 2A:
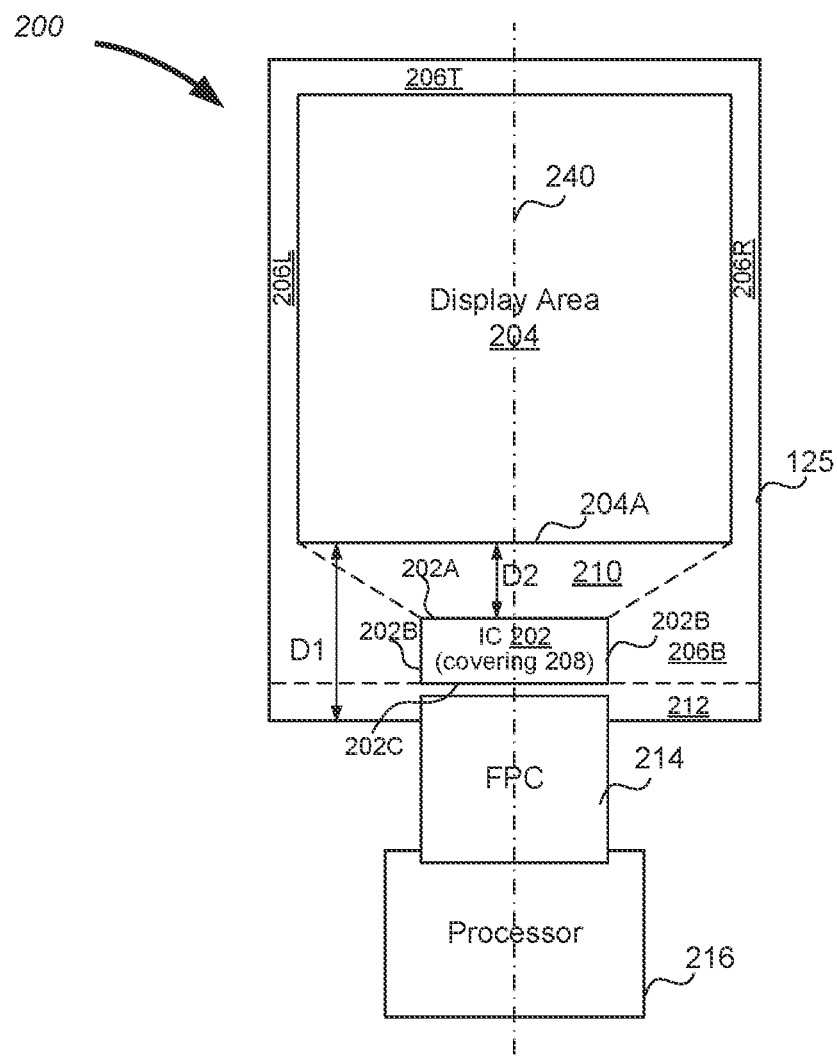
FIG. 2A is an example electronic device having a display screen using a driver chip, in accordance with some embodiments.
Figure 2A:
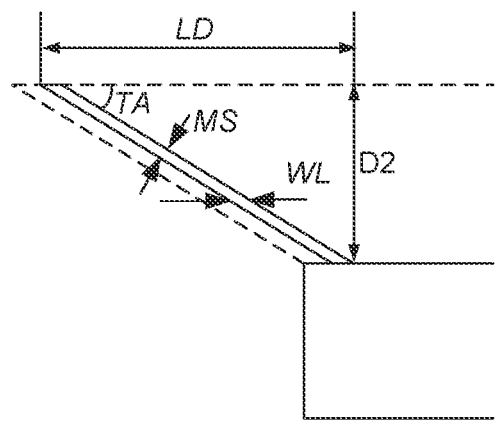

FIG. 2A is an example electronic device 200 having a display screen 125 using a driver chip 202, in accordance with some embodiments. The display screen 125 includes a display area 204 on which display elements are formed from a common electrode layer 168, a display electrode layer 170, and an LCD display layer 172. In some embodiments, the display area 204 further includes an array of capacitive sense elements that are formed from two electrode layers and an intermediate dielectric layer. The display area 204 is surrounded by a bezel 206 on the display screen 125. The bezel 206 has four bezel regions 206T, 206L, 206R, and 206B. The bottom bezel region 206B includes a driver area 208 and a fan-out area 210. The driver chip 202 is disposed on the driver area 208 and in proximity to a display edge 204A of the display area 204. The driver area 208 and the display area 204 are separated by the fan-out area 210 of the display screen 125. A plurality of interconnects are routed on the fan-out area 210 to electrically couple the display elements and capacitive sense elements (if any) on the display area 204 to the driver chip 202 disposed on the driver area 208 of the display screen 125. The bezel 206 has a bezel width D1 in the bottom bezel region 206B, and the fan-out area has a fan-out area height D2 measured from the display edge 204A of the display area 204 to a first edge 202A of the driver chip 202. In some situations, the fan-out area height D2 is critical for narrowing the bezel width DI of the bottom bezel region 206B, and any reduction of the fan-out area height D2 helps reduce the bezel width D1 of the bottom bezel region 206B directly.

In some implementations, the bezel 206 has a bezel width that varies between the four sides of the touch display screen 125 (e.g., the left bezel region 206L and the right bezel region 206R are narrower than the bottom bezel region 206B). Typically, the bezel width is identical on the left side and on the right side of the display area 125. In many situations, given that the driver chip 202 is placed on the bottom bezel region 206B, the bottom bezel region 206B can only be reduced to a bezel width limit that is greater than the bezel width of any other bezel regions 206T, 206L and 206B. In some implementations, the bezel width is reduced below a threshold bezel width at least on the left side and on the right side of the display screen 125. Conversely, in some implementations, the bezel width is reduced below a threshold width at all four sides of the display screen 125. For example, an industrial definition for a bezel-less electronic device requires the threshold width to be less than 2 mm, and the bezel width has to be reduced below 2 mm at all four sides of the display screen 125. In some examples, a cathode ray tube has a bezel width of two inches or more, and an LCD display has a bezel width less than one inch. A small bezel width (e.g., less than 2 mm) makes the display area 204 of the display screen 125 look larger, and multiple touch display screens 125 look more like a single screen when placed side by side.

The driver chip 202 has a first edge 202A facing the display area 204, two second edges 202B connected to the first edge 202A, and a third edge 202C opposite the first edge 202A. The display screen 125 further includes a fan-in area 212 in proximity to the third edge 202C of the driver chip 202 when the driver chip 202 is disposed on the driver area 208. In some embodiments, a first end of a flexible printed circuit (FPC) cable 214 is disposed on the fan-in area 212. Interconnects are routed on the fan-in area 212 to electrically couple at least the driver chip 202 to the FPC cable 214, such that the FPC cable 214 can provide one or more input signals to the driver chip 202 or receive one or more output signals from the driver chip 202. The FPC cable 214 has a second end opposite the first end. In some embodiments, the second end of the FPC cable 214 is electrically coupled to a processor 216 (e.g., a processing core 109 in FIG. 1A), and the FPC cable 214 is configured to facilitate exchanging the input and output signals between the driver chip 202 and the processor 216.

In some embodiments, the interconnects routed on the fan-out area 210 and fan-in area 212 are formed on the same routing layer 180. In some situations, the same routing layer 180 is only formed on the bezel 206 of the display screen 125, and electrodes formed on the display and common electrode layers 170 and 168 are substantially limited on the display area 204 and electrically coupled to the interconnects of the routing layer 180 via electrical contacts located around the display area 204. Alternatively, in some situations, the routing layer 180 is extended from one of the display and common electrode layers 170 and 168, and the other one of the electrodes layers 170 and 168 is electrically coupled to the interconnects of the routing layer 180 via electrical contacts located around the display area 204. Further, in some embodiments, the display area 204 includes both display elements and capacitive sense elements. Electrodes that are formed on first and second electrode layers associated with the capacitive sense elements are substantially limited on the display area 204, and electrically coupled to the interconnects of the routing layer 180 via electrical contacts located around the display area 204. Alternatively, in some situations, the routing layer 180 is extended from one of the first and second electrode layers associated with the capacitive sense elements. The other one of the first and second electrode layers associated with the capacitive sense elements, display electrode layers 170, and common electrode layer 168 are electrically coupled to the interconnects of the routing layer 180 via electrical contacts located around the display area 204.

Figure 2B:
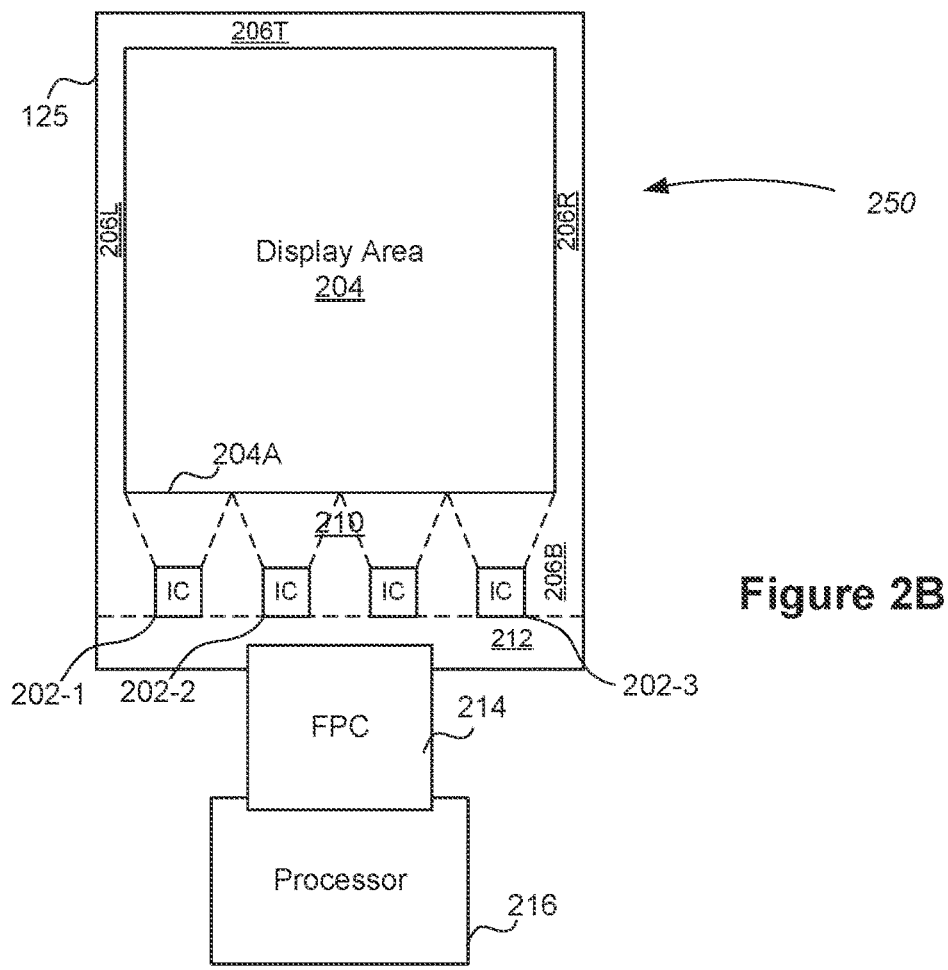
FIG. 2B is an example electronic device having a display screen using a plurality of driver chips, in accordance with some embodiments.

FIG. 2B is an example electronic device 250 having a display screen 125 using a plurality of driver chips 202, in accordance with some embodiments. The display elements and capacitive sense elements (if any) are electrically coupled to multiple driver chips 202. The bottom bezel region 206B includes a plurality of driver areas 208 and a fan-out area 210. Each driver chip 202 is disposed on a respective driver area 208 and in proximity to a display edge 204A of the display area 204. The driver areas 208 and the display area 204 are separated by the fan-out area 210 of the display screen 125. The plurality of interconnects are routed on the fan-out area 210 to electrically couple each driver chip 202 to a respective subset of the display elements and capacitive sense elements (if any) on the display area 204.

Each driver chip 202 has a first edge 202A facing the display area 204, two second edges 202B connected to the first edge 202A, and a third edge 202C opposite the first edge 202A. The display screen 125 further includes a fan-in area 212 in proximity to the third edge 202C of the driver chips 202 when the driver chips 202 are disposed on the driver areas 208. In some embodiments, interconnects are routed on the fan-in area 212 to electrically couple at least two immediately adjacent driver chips 202 to each other. In some embodiments, a first end of a flexible printed circuit (FPC) cable 214 (also called a display data link) is disposed on the fan-in area 212. Interconnects are routed on the fan-in area 212 to electrically couple at least a subset of the driver chips 202 to the FPC cable 214, such that the FPC cable 214 can provide one or more input signals to the subset of driver chips 202 or receive one or more output signals from the subset of driver chips 202. In some embodiments, a second end of the FPC cable 214 is electrically coupled to a processor 216 (e.g., a processing core 109 in FIG. 1A), and the FPC cable 214 is configured to facilitate exchange of the input and output signals between the driver chips 202 and the processor 216 and allow the processor 216 to coordinate operations of the driver chips 202.

Referring to FIG. 2A, in some embodiments, the display edge 204A of the display area 204 is substantially larger than the first edge 202A of the driver chip 202. In an example, the display edges 204A and first edge 202A are approximately 13 inches and 1 inch, respectively. A lateral width (WL) of each interconnect is measured in a direction parallel to the first edge 202A of the driver chip 202, and is fixed once a dimension of the first edge 202A and a total number of interconnects are known. A minimal titling angle (TA) is determined for the interconnects routed on the fan-out area 210 based on the lateral width and a minimum feature size (MS) of each interconnect. This minimal titling angle is associated with the leftmost interconnect, and sets a minimum value for the fan-out area height D2 of the fan-out area 210 based on a lateral distance (LD) of the leftmost interconnect. In contrast, referring to FIG. 2B, the first edge 202A of each driver chip 202 only corresponds to a portion of the display edge 204A of the display area 204. For example, four driver chip 202 are applied, and each driver chip 202 corresponds to a quarter of the display area 204. The portion of the display edge 204A and the first edge 202A are approximately 2.25 inches and 1 inch, respectively. For each driver chip 202, the same minimal titling angle (TA) associated with the leftmost interconnect applies. The lateral distance of the leftmost interconnect of each driver chip 202 is reduced, so are the fan-out area height D2 of the fan-out area 210 and the bezel width DI of the bottom bezel region 206B.

Figure 2C:
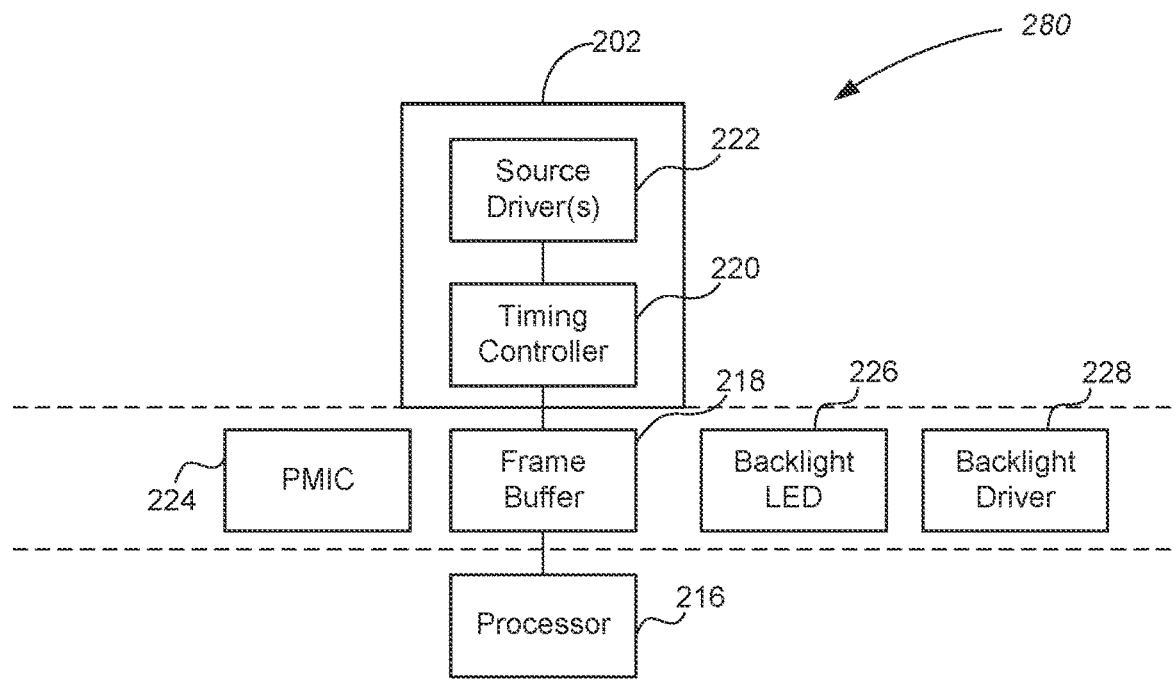
FIG. 2C a block diagram of a periphery system coupled to a display screen in an electronic device, in accordance with some embodiments.

FIG. 2C a block diagram of a periphery system 280 coupled to a display screen 125 in an electronic device 200 or 250, in accordance with some embodiments. The periphery system 280 includes the driver chip 202, a frame buffer 218, and a processor 216. The driver chip 202 includes a timing controller 220 and a plurality of source drivers 222, and each source driver 222 corresponds to a respective subset of the display area 204. The frame buffer 218 stores digital display data provided by the processor 216 on a frame basis. The timing controller 220 processes the display data received from a source (e.g., the frame buffer 218, the processor 216, or external computing systems including a set-top box, digital video disk player) and generates display panel interface signals for driving the source drivers 222. The timing controller 220 receives display and control data from the processor 216 and generates control and data signals to cause the display data to be displayed on the display screen 125. In some embodiments, the timing controller 220 stores the received display data in the frame buffer 218. The frame buffer 218 includes a memory configured to store the display data. To individually address each display element, the timing controller 220 applies control and data signals to a specified row driver and source driver 222 to enable or disable the pixel located at the intersection of the specified row and column. In some embodiments, each display element within a column of pixels included in the display screen 125 is connected to a source driver 222 via one or more data bus lines 124. The magnitude of the voltage of the display data signal carried by the one or more data bus lines 124 determines the amount of light transmission supplied by each corresponding display element located in the display screen 125.

In some embodiments, the driver chip 202 includes the source drivers 222, and does not include the timing controller 220. The timing controller 220 interfaces with the display screen 125 using the FPC cable 214 (also called display data link 214). The display data link 214 includes multiple point-to-point interconnects that couple the output of the timing controller 220 to each source driver 222. In an example, the display data link 214 is a point-to-point intra panel interface that conforms to the Scalable Intra Panel Interface (SIPI) standard.

The source driver 222 receives multi-bit digital display data from the timing controller 220 via a signal line included in the display data link 214, converts the display data to analog voltage signals, and sends the analog voltage signals to a specified column of sub-pixels using the column line. The number of data bits used to represent a display data value determines the number of light levels that a particular sub-pixel may produce. For example, 10-bit display data may be converted into 1024 analog signal levels generated by the output buffers included in a source driver 222. A measure of the intensity of the light emitted by each sub-pixel may be represented as a gray level. In one implementation, the gray level is represented by a multi-bit value ranging from 0, corresponding to black, to a maximum value. In one example, a gray level is a 10-bit value representing one of 1024 values, with a maximum value of 1023.

The source drivers 222 are part of the pixel drive circuit 102, and are optionally integrated into a single driver chip 202 (FIG. 2A) or a plurality of driver chips (FIG. 2B). The timing controller 220 is also part of the pixel driver circuit 102, and is optionally located on the driver chip(s) 202 or on an IC chip or circuit board integrating remaining components of the processing device 110. In some embodiments, programs enabling functions of the pixel drive circuit 102 may be generated and compiled for incorporation into other integrated circuits. For example, behavioral level code describing the pixel drive circuit 102, or portions thereof, may be generated using a hardware descriptive language, such as VHDL or Verilog, and stored to a machine-accessible medium (e.g., NVM 104, RAM 105, CD-ROM, hard disk, floppy disk, or flash memory). Furthermore, the behavioral level code can be compiled into register transfer level ("RTL") code, a netlist, or a circuit layout, and stored onto a machine-accessible medium. The behavioral level code, the RTL code, the netlist, and the circuit layout may represent various levels of abstraction to describe and control the functions of the pixel drive circuit 102.

The periphery system 280 further includes one or more of: a power management integrated circuit (PMIC) component 224, a backlight light emitting diode (LED) component 226, and a backlight driver 228. The PMIC component 224 is configured to provide and manage power for the periphery system 280 coupled to the display screen 125. The backlight LED component 226 is configured to apply LEDs to provide backlight illumination for LCD display cells in the display screen 125, and the backlight driver 228 is configured to drive the backlight LED component 226.

Figure 3:
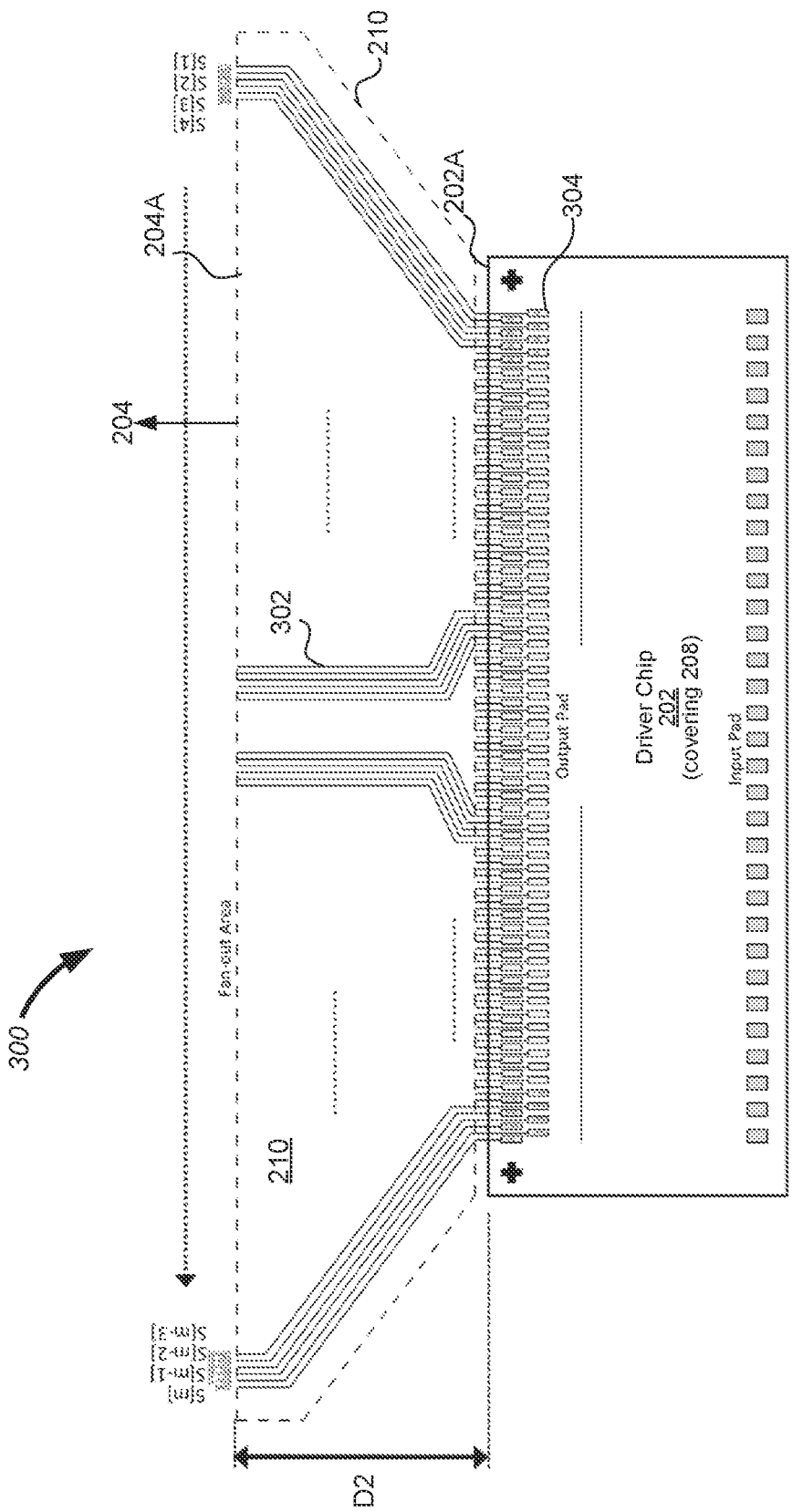
FIG. 3 is an example bezel region of a display screen in which all interconnects contact a driver chip from a single edge of the driver chip, in accordance with some embodiments.

FIG. 3 is an example bezel region 300 of a display screen 125 in which all interconnects 302 contact a driver chip 202 from a single edge 202A of the driver chip 202, in accordance with some embodiments. The bezel region 300 is immediately adjacent to a display area 204, and includes a fan-out area 210 and a driver area 208 that is covered by the driver chip 202. The driver chip 202 is disposed on the driver area 208 such that the first edge 202A of the driver chip 202 is adjacent to the display area 204. The driver chip 202 further includes one or more rows of electronic pads 304 proximate to the first edge 202A. The display screen 125 further includes a plurality of interconnects 302 that extend from the display edge 204A of the display area 204 to the one or more rows of electronic pads 304 of the driver chip 202. At the display edge 204A of the display area 204, the plurality of interconnects 302 include m interconnects, where m is an integer number, and are arranged according to a predefined connection order. Starting from a right most interconnect 302, the plurality of interconnects 302 are numbered from 1 to m successively. At the first edge 202A of the driver chip 202, the electronic pads 304 include at least m pads to be consistent with the plurality of interconnects 302 and are arranged according to the predefined connection order to receive the plurality of interconnects 302. Starting from a right most pad on FIG. 3, the one or more rows of electronic pads 304 are numbered from 1 to m successively.

Figure 4A:
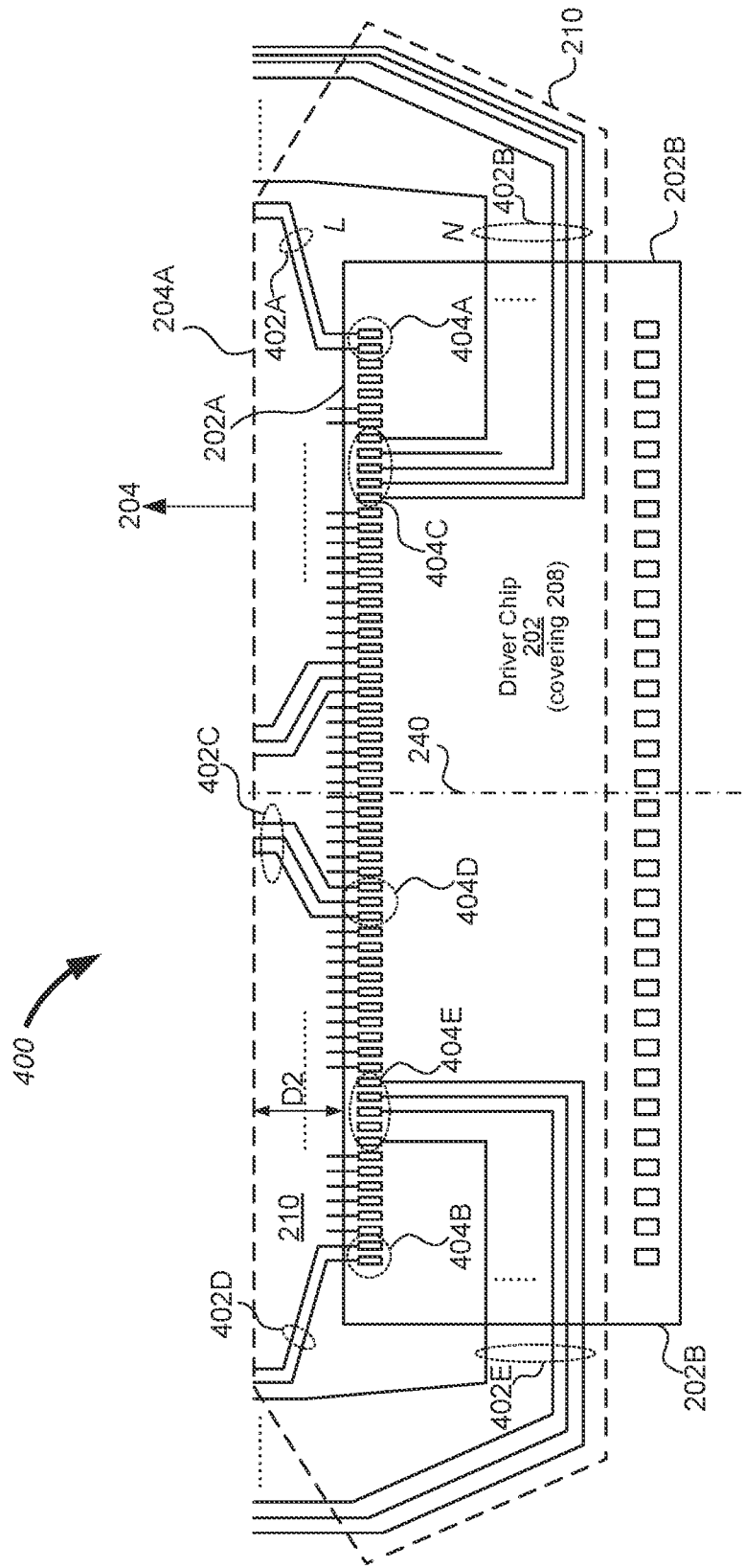
FIG. 4A is an example bezel region of a display screen in which interconnects extending from a display area contact a single row of a driver chip from two or more edges of the driver chip, in accordance with some embodiments.

FIG. 4A is an example bezel region 400 of a display screen 125 in which interconnects 402 extending from a display area 204 contact a single row of a driver chip 202 from two or more edges of the driver chip 202, in accordance with some embodiments. The bezel region 400 is immediately adjacent to a display area 204, and includes a fan-out area 210 and a driver area 208 that is covered by the driver chip 202. The driver chip 202 is disposed on the driver area 208 such that the first edge 202A of the driver chip 202 is immediately adjacent to the display area 204, i.e., the first edge 202A faces a display edge 204A of the display area 204 and is closer to the display area 204 than any other edge of the driver chip 202. The driver chip 202 further includes a first row of electronic pads 404 proximate to the first edge 202A. In an example, the first row of electronic pads 404 extends along a straight first row line 406 that is substantially parallel to the first edge 202A. As explained above, the display screen 125 is used in one of a laptop display, a tablet computer display, and a mobile phone display, and the driver chip 202 includes at least a plurality of source drivers 222 configured to drive a plurality of display elements. In some embodiments, the driver chip 202 includes a timing controller 220 configured to control driving of the plurality of display elements in a synchronous manner.

The display screen 125 further includes a plurality of interconnects 402 that extends from the display edge 204A of the display area 204 to the driver area 208. The driver chip 202 is flip-chip disposed onto the driver area 208, allowing the plurality of interconnects 402 to reach and form electrical contacts with the first row of electronic pads 404 of the driver chip 202. The plurality of interconnects 402 contact the first row of electronic pads 404 from at least two edges of the driver chip 202, e.g., enter the driver area 208 from the first edge 202A and one or more second edges 202B of the driver chip 202 to come into contact with the first row of electronic pads 404. In an example, the one or more second edges 202B includes one or two side edges connected to the first edge 202A of the driver chip 202. The plurality of interconnects 402 are allowed to route across both the first edge 202A and the one or more second edges 202B to access the first row of electronic pads 404. The fan-out area 210 is not limited to an area between the display area 204 and the driver chip 202, and is expanded to include at least areas immediately adjacent to the one or more second edges 202B of the driver chip 202 and partially surround the driver area 208 that supports the driver chip 202. Stated another way, the driver chip 202 is partially surrounded by the fan-out area 210.

The first row of electronic pads 404 have a first subset of end pads 404A at a first end of the first row, a second subset of end pads 404B at a second opposite end of the first row, and a first subset of intermediate pads 404C located between the first subset of end pads 404A and the second subset of end pads 404B. The first subset of end pads 404A physically contact a first subset of interconnects 402A from the first edge 202A of the driver chip 202, and the first subset of intermediate pads 404C physically contact a second subset of interconnects 402B from the one or more second edges 202B. At the display edge 204A of the display area 204, the plurality of interconnects 402 include m interconnects, where m is an integer number, and are arranged according to a predefined connection order. Starting from a right most interconnect 402 on FIG. 4A, the plurality of interconnects 402 are numbered from 1 to m successively. At the first edge 202A of the driver chip 202, the electronic pads 404 include at least m pads to receive the plurality of interconnects 402, and however, are arranged according to a distinct connection order. For example, the first subset of intermediate pads 404C have a first number N of electronic pads, and the first subset of end pads 404A have a second number L of electronic pads. Starting from a right most pad on FIG. 4A, the first subset of end pads 404A correspond to the (N+1)-th to (N+L)-th interconnects 402 successively, consistent with the predefined connection order of the interconnects 402. The first subset of intermediate pads 404C immediately follow the first subset of end pads 404A and correspond to the N-th to first interconnects 402 successively in a reverse order, which is opposite to the predefined connection order of the interconnects 402. By these means, at least the second subset of interconnects 402B associated with the first subset of intermediate pads 404C do not need to access the electronic pads via the first edge 202A of the driver chip 202, thereby facilitating reduction of the fan-out area height D2.

In some embodiments, the first row of electronic pads 404 further include a second subset of intermediate pads 404D. The first subset of intermediate pads 404C are located between the second subset of intermediate pads 404D and the first subset of end pads 404A, and the second subset of intermediate pads 404D physically contact a third subset of interconnects 402C from the first edge 202A. Further, in some embodiments not shown in FIG. 4A, each of the third subset of interconnects 402C is shorter than that of the first subset of interconnects 402A, and at least partially has a respective serpentine shape with a respective length that matches that of the first subset of interconnects 402A.

Referring to FIG. 4A, the second subset of end pads 404B physically contact a corresponding subset of interconnects 402D from the first edge 202A. In some embodiments, the first subset of end pads 404A include more than one pad that are located at the first end of the first row, and the second subset of end pads 404B include more than one pad that are located at the second opposite end of the first row.

In some embodiments, the second subset of interconnects 402B includes a first number N of interconnects corresponding to the first subset of intermediate pads 404C. The first number N is determined based on a length of the two side edges 202B connecting to the first edge. The plurality of interconnects 402 further include a remaining number P of interconnects 402 that physically access the first row of electronic pads 404 from the first edge 202A of the driver chip 202. A height of the fan-out area (i.e., the fan-out area height D2) is configured to accommodate the remaining number P of interconnects 402 that are routed from the display area 204 to the first row of electronic pads 404 via the first edge 202A of the driver chip 202. In some situations, the remaining number P of interconnects 402 are formed between the first subset of interconnects 402A and another subset of interconnects 402D contacting the second subset of end pads 404B.

In some embodiments, the plurality of interconnects 402 are formed on a single layer of conductive material (e.g., the routing layer 180 in FIG. 1B), cannot cross each other, and are spatially ordered on a display substrate of the display screen 125 (e.g., in a glass substrate). Given the single layer of conductive material, only outmost interconnects 402 (e.g., 402B) can be routed across, and contact the first row of electronic pads 404 from, the one or more second edges 202B of the driver chip 202. In this application, the outmost interconnects 402 are not electrically coupled to the leftmost and rightmost pads 404A and 404B in the first row of electronic pads 404. The outmost interconnects 402 optionally includes a single interconnect or more than one interconnect crossing either one of a left side and a right side of the driver chip 202.

In some embodiments, an overall routing pattern of the plurality of interconnects 402 is symmetric with respect to a central axis 240 of the display screen 125. The second subset of interconnects 402B access the intermediate pads 404C from the right edge of the driver chip 202, and a corresponding subset of interconnects 402E access another subset of intermediate pads 404E from the left edge of the driver chip 202. The driver chip 202 is preferably symmetric with respect to the central axis 240 of the display screen 125. Alternatively, in some embodiments, the overall routing pattern of the plurality of interconnects 402 is asymmetric with respect to the central axis 240 of the display screen 125. The driver chip 202 is shifted with respect to the central axis 240 of the display screen 125 to reduce the fan-out area height D2. For example, a subset of leftmost interconnects 402E is connected to the second subset of end pads 404B rather than a subset of intermediate pads 404E, and the entire driver chip 202 is shifted towards the left of the central axis 240 of the display screen 125.

It is noted that the interconnects 402 routed via the first edge 202A are shorter interconnects 402 routed via the one or more second edges 202B and that the interconnects 402 routed via the first edge 202A have different lengths based on their positions relative to the driver chip 202. In some embodiments, each of the first subset of interconnects 402A at least partially has a respective serpentine shape with a respective length that matches that of the second subset of interconnects 402B. In some embodiments, each of the third subset of interconnects 402C at least partially has a respective serpentine shape and has a respective length that matches that of the first subset of interconnects 402A. Additionally, in some embodiments, the driver chip 202 includes an interconnect compensation component configured to generate electrical signals that compensate for parasitics (e.g., parasitic resistance) of one or more interconnects of the plurality of interconnects 402 actively.

Figure 4B:
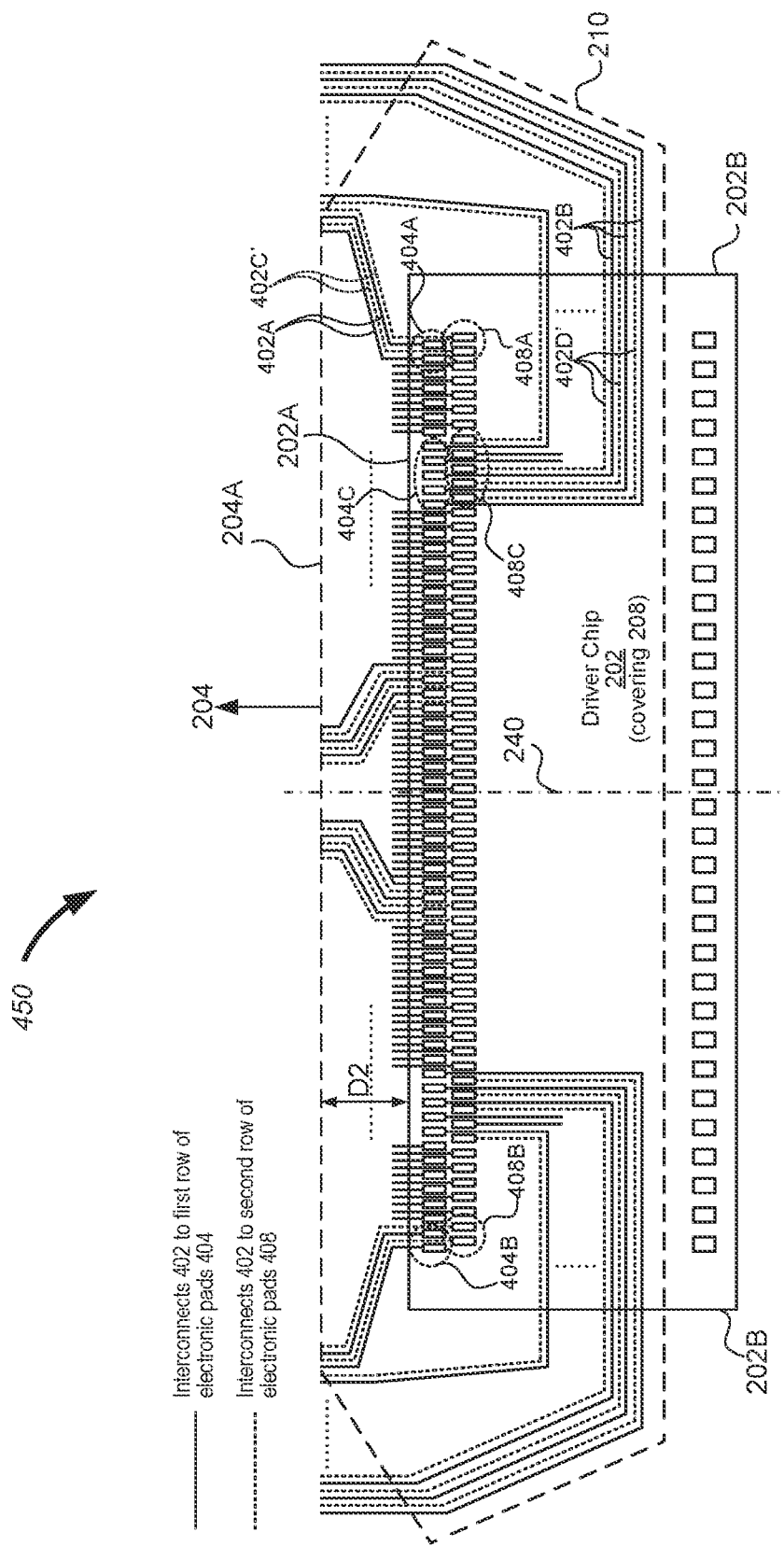
FIG. 4B is another example bezel region of a display screen in which interconnects extending from a display area contact two rows of pads of a driver chip from two or more edges of the driver chip, in accordance with some embodiments.

FIG. 4B is another example bezel region 450 of a display screen 125 in which interconnects 402 extending from a display area 204 contact two rows of pads of a driver chip 202 from two or more edges of the driver chip 202, in accordance with some embodiments. Compared with the driver chip 202 in FIG. 4A, the driver chip 202 in FIG. 4B further includes a second row of electronic pads 408 proximate to the first edge 202A and the first row of electronic pads 404. The second row of electronic pads 408 include a third subset of end pads 408A at a third end of the second row, a fourth subset of end pads 408B at a fourth end of the second row, and a second subset of intermediate pads 408C located between the third subset of end pads 408A and the fourth subset of end pads 408B. The third subset of end pads 408A physically contacts a third subset of interconnects 402C' from the first edge 202A of the driver chip 202. The second subset of intermediate pads 408C physically contact a fourth subset of interconnects 402D' from the one or more second edges 202B of the driver chip 202. The first subset of interconnects 402A and third subset of interconnects 402C' interleave with each other, and the second subset of interconnects 402B and fourth subset of interconnects 402D' interleave with each other.

Additionally, in some embodiments not shown in FIG. 4B, the driver chip 202 further including one or more third rows of electronic pads proximate to the first edge 202A and the second row of electronic pads 408. Each of the one or more third rows of electronic pads include a fifth subset of end pads at a fifth end of the respective third row, a sixth subset of end pads at a sixth opposite end of the respective third row, and a third subset of intermediate pads located between the fifth subset of end pads and the sixth subset of end pads. The fifth subset of end pads physically contacts a fifth subset of interconnects from the first edge. The first subset of interconnects 402A, third subset of interconnects 402C', and fifth subset of interconnects interleave with each other. The third subset of intermediate pads physically contact a sixth subset of interconnects from the one or more second edges 202B of the driver chip. The second subset of interconnects 402B, fourth subset of interconnects 402D', and the sixth subset of interconnects interleave with each other, and get access to their respective electronic pads from the one or more second edges 202B.

Figure 5A:
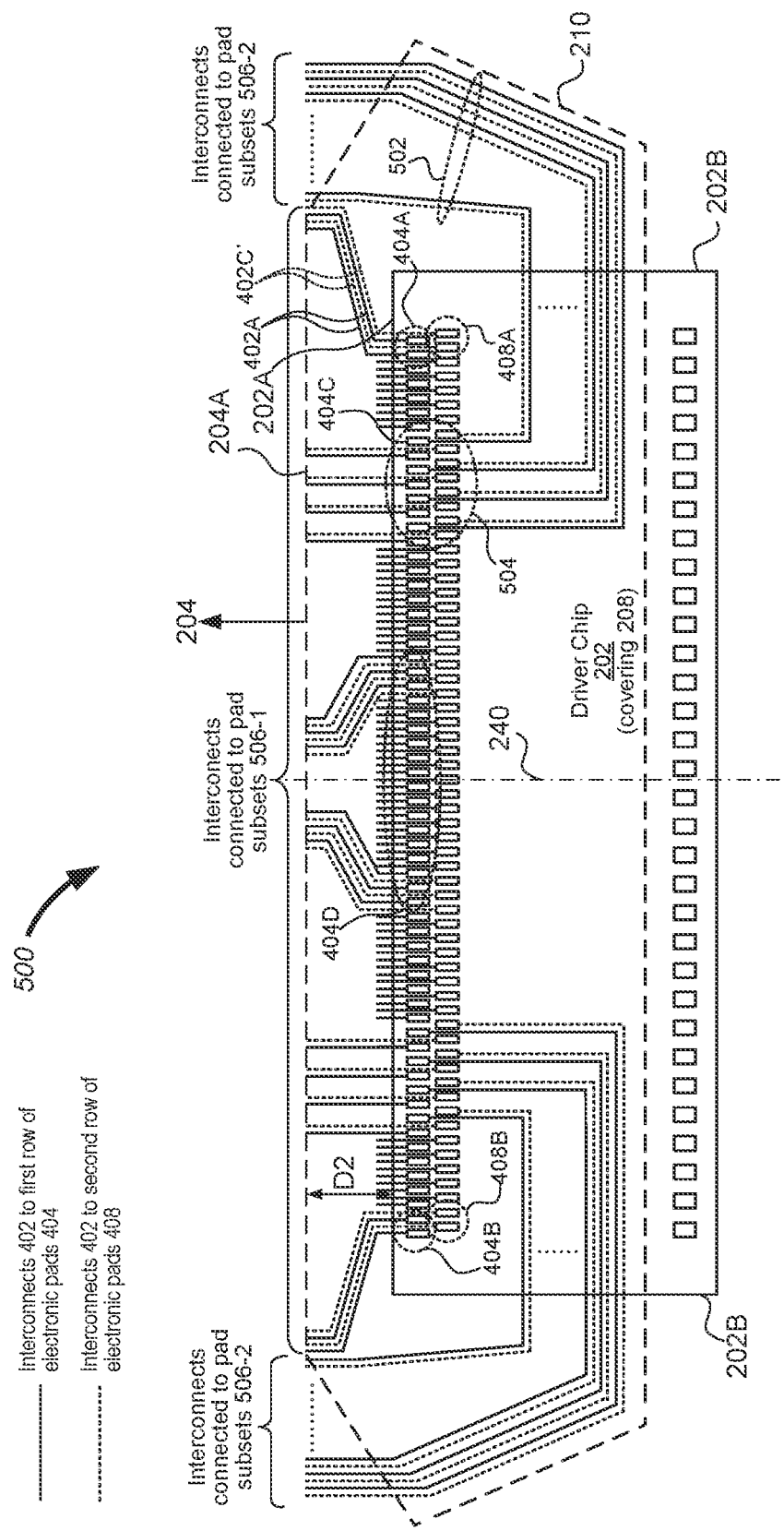
FIG. 5A is an example bezel region of a display screen in which interconnects contact one or more rows of electronic pads of a driver chip from two or more edges using an alternating scheme, in accordance with some embodiments.
Figure 5C:
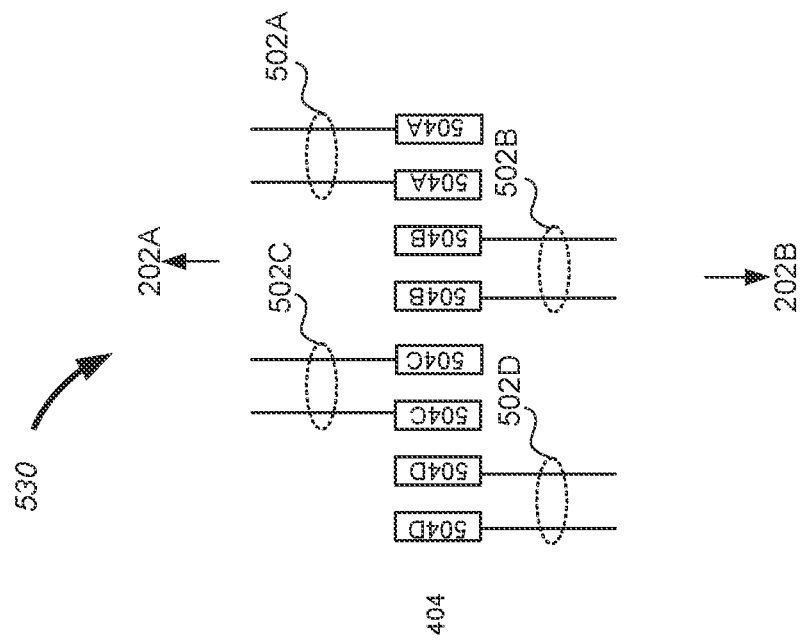
FIGS. 5B-5E are exploded views of interleaving pad subsets in accordance with some embodiments.
Figure 5B:
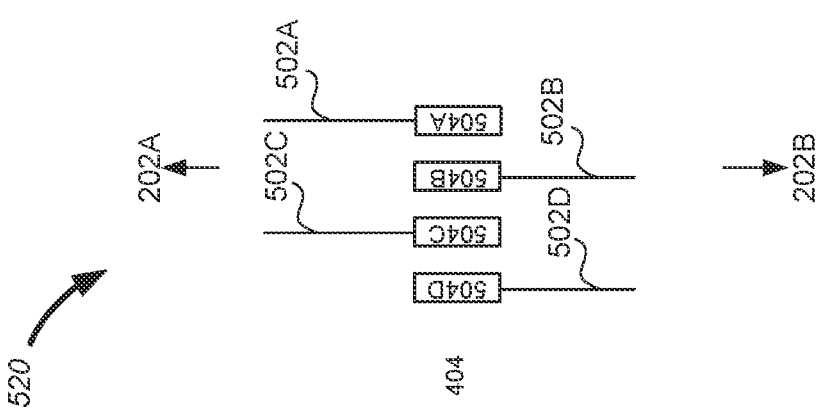
Figure 5E:
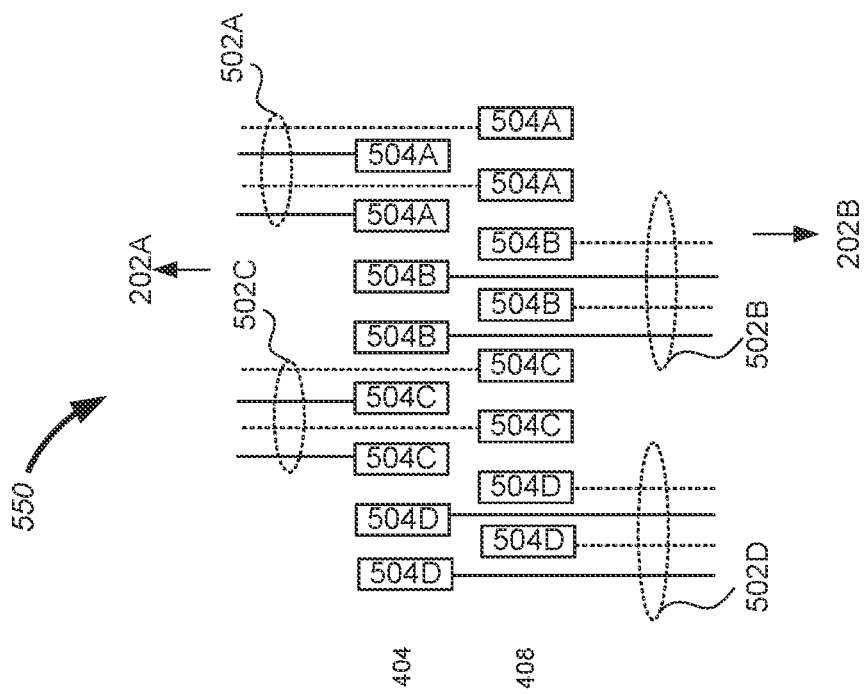

FIG. 5A is an example bezel region 500 of a display screen 125 in which interconnects 402 contact one or more rows of electronic pads of a driver chip 202 from two or more edges using an alternating scheme, in accordance with some embodiments, and FIGS. 5B-5E are exploded views of interleaving pad subsets 520, 530, 540, and 550 in accordance with some embodiments. The bezel region 500 is immediately adjacent to a display area 204, and includes a fan-out area 210 and a driver area 208 that is covered by the driver chip 202. The driver chip 202 is disposed on the driver area 208 such that the first edge 202A of the driver chip 202 is adjacent to the display area 204. The driver chip 202 further includes at least a first row of electronic pads 404 proximate to the first edge 202A. The first row of electronic pads 404 have a first subset of end pads 404A at a first end of the first row, a second subset of end pads 404B at a second opposite end of the first row, and a first subset of intermediate pads 404C located between the first subset of end pads 404A and the second subset of end pads 404B.

In some embodiments, the first row of electronic pads 404 further include a plurality of adjacent subsets of intermediate pads 504 that are located between the first subset of end pads 404A and the second subset of end pads 404B and spatially ordered in the first row. The plurality of adjacent subsets of intermediate pads 504 alternatingly contact respective subsets of interconnects 502 routed from a respective second edge 202B and from the first edge 202A, i.e., the subsets of interconnects 502 crossing the respective second edge 202B and the subsets of interconnects 502 crossing the first edge 202A alternatingly come into contact with the plurality of adjacent subsets of intermediate pads 504. For example, referring to FIGS. 5B and 5C, four subsets of intermediate pads 504A, 504B, 504C, or 504D are successively arranged from right to left. According to this alternating scheme, the first subset of interconnects 502A pass the first edge 202A to contact and electrically couple to a corresponding subset of intermediate pads 504A, the second subset of interconnects 502B pass the second edge 202B to contact and electrically couple to a corresponding subset of intermediate pads 504B, the third subset of interconnects 502C pass the first edge 202A to contact and electrically couple to a corresponding subset of intermediate pads 504C, the fourth subset of interconnects 502D pass the second edge 202B to contact and electrically couple to a corresponding subset of intermediate pads 504D, and so on. In this example of FIG. 5B, each adjacent subset 504A-504D of intermediate pads includes a single intermediate pad. In another example of FIG. 5C, each adjacent subset 504A-504D of intermediate pads includes two or more intermediate pads, i.e., every two or more immediately adjacent intermediate pads 504 contact interconnects 502 from the same first or second edge 202A or 202B of the driver chip 202.

Additionally, in some embodiments, the alternating scheme is applied to two or more rows of electronic pads (e.g., rows 404 and 408). For each row of electronic pads, two end pads at two opposite ends of the respective row contact their corresponding interconnects 402 routed via the first edge 202A of the driver chip 202, and the intermediate pads between the two end pads can be grouped into pad subsets (e.g., 504A-504D) that alternatingly contact the corresponding interconnect subsets 502A-502D routed via the first edge 202A and second edges 202B of the driver chip 202. Additionally, each pad subset of one of the two or more rows is associated and grouped with a respective counterpart subset of the other row(s), such that the pad subsets 504A-504D alternate between the corresponding interconnect subsets 502A-502D routed via the first edge 202A and second edges 202B concurrently for all of the two or more rows. Any interconnect 402 accessing a first row of electronic pads 404 from the second edge 202B passes through an open space between two neighboring pads of a second row of electronic pads 408. Any interconnect 402 accessing the second row of electronic pads 408 from the first edge 202A passes through an open space between two neighboring pads of the row of electronic pads 404.

Figure 5D:
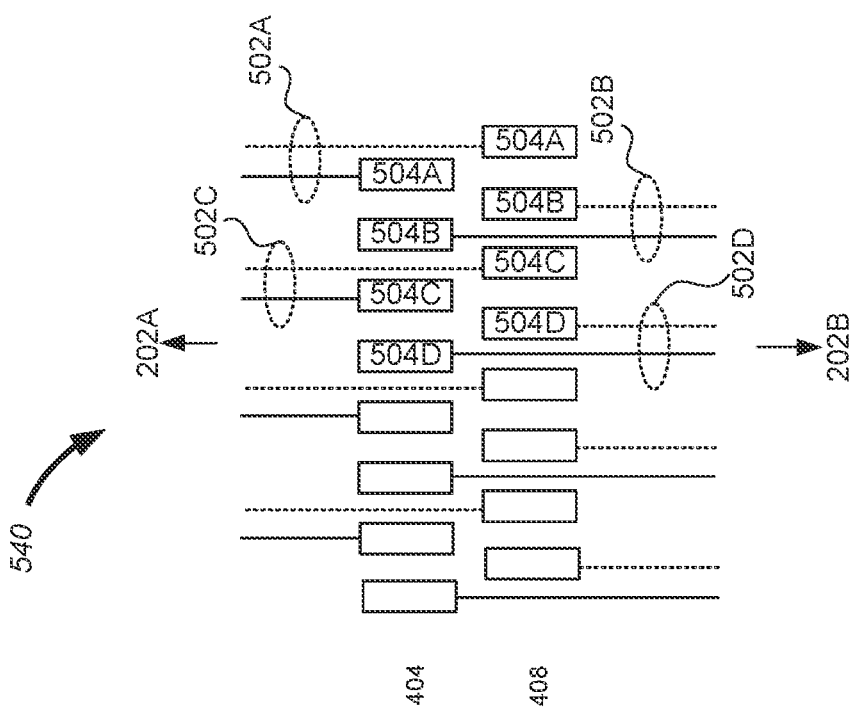

In the example shown in FIG. 5D, each pad subset (e.g., 504A) includes a pad from the first row 404 and an adjacent pad from the second row 408, and is followed by a respective adjacent pad subset (e.g., 504B) includes a neighboring pad from the first row 404 and a neighboring pad of the adjacent pad from the second row 408. The respective pad subset (e.g., 504A) is connected to a correspond interconnect subset (e.g., 502A) routed from one of the first and second edges of the driver chip 202, and the respective adjacent pad subset (e.g., 504B) is connected to another correspond interconnect subset routed from the other one (e.g., 502B) of the first and second edges of the driver chip 202. Alternatively, in an example shown in FIG. 5E, each pad subset (e.g., 504A) includes two or more neighboring pads from the first row 404 and two or more adjacent neighboring pads from the second row. Each corresponding interconnect subset (e.g., 502A) includes a plurality of interconnects to access the two or more neighboring pads in the two rows 404 and 408 alternatingly, from the same first or second edge of the driver chip 202.

The plurality of interconnects 402 include m interconnects, where m is an integer number, and are arranged according to a predefined connection order at the display edge 204A of the display area 204. Starting from a right most interconnect 402, the plurality of interconnects 402 are numbered from 1 to m successively. Referring to FIG. 5A, each row of electronic pads 404 or 408 include at least m/2 pads to be consistent with the plurality of interconnects 402, and are arranged according to a mixed connection order different from the predefined connection order. Specifically, in each row of electronic pads 404 or 408, a first type of pads corresponding to the interconnects that access the electronic pads 404 and 408 from the first edge 202A follow the predefined connection order, and a second type of pads corresponding to the interconnects that access the electronic pads 404 and 408 from the one or more second edges 202B have a reversed connection order and are inserted into the first type of pads. The first type of pads have a plurality of pad subsets 506-1 that follows the predefined connection order, and the second type of pads having a plurality of pad subsets 506-2 that reverses the predefined connection order. In some embodiments, the alternating scheme (e.g., FIGS. 5B-5E) includes a plurality of in-sequence pad subsets 506-1 and a plurality of reversely-ordered pad subsets 506-2, and the in-sequence pad subsets 506-1 are interleaved with the reversely-ordered pad subsets 506-2.

Figure 6:
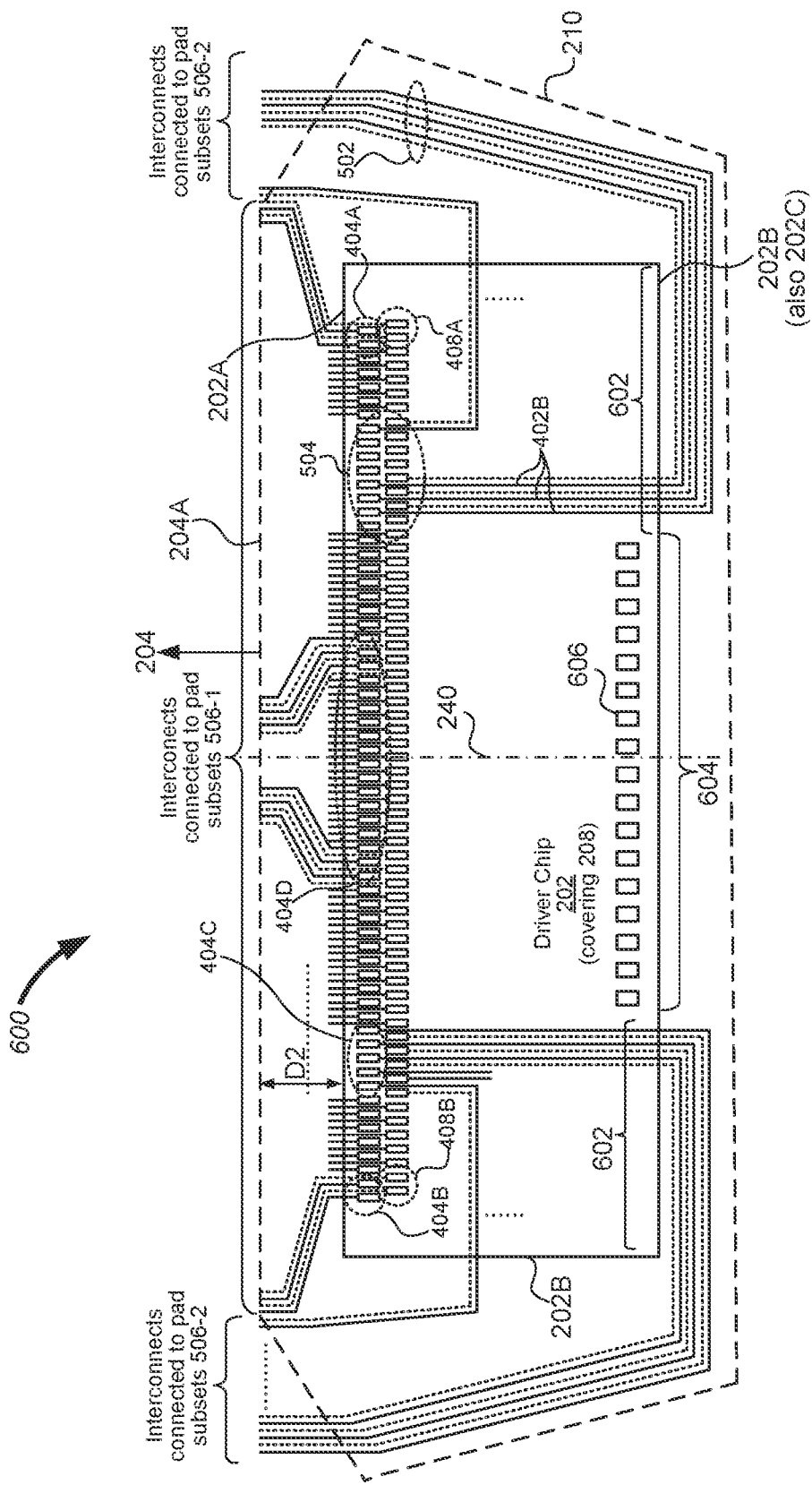
FIG. 6 is an example bezel region of a display screen in which interconnects contact electronic pads of a driver chip from at least a bottom edge of the driver chip, in accordance with some embodiments.

FIG. 6 is an example bezel region 600 of a display screen 125 in which interconnects 402 contact electronic pads of a driver chip 202 from at least a bottom edge of the driver chip 202, in accordance with some embodiments. The bezel region 600 is immediately adjacent to a display area 204, and includes a fan-out area 210 and a driver area 208 that is covered by the driver chip 202. The driver chip 202 is disposed on the driver area 208 such that the first edge 202A of the driver chip 202 is adjacent to the display area 204. The driver chip 202 further includes at least a first row of electronic pads 404 proximate to the first edge 202A. The first row of electronic pads 404 have a first subset of end pads 404A at a first end of the first row, a second subset of end pads 404B at a second opposite end of the first row, and a first subset of intermediate pads 404C located between the first subset of end pads 404A and the second subset of end pads 404B. The first subset of end pads 404A physically contact a first subset of interconnects 402A from the first edge 202A of the driver chip 202, and the first subset of intermediate pads 404C physically contact a second subset of interconnects 402B from the one or more second edges 202B of the driver chip 202.

In some embodiments, the one or more second edges 202B are distinct from the first edge 202A and include a third edge 202C (also called a bottom edge) of the driver chip 202. The third edge 202C of the driver chip 202 opposes and is parallel to the first edge 202A of the driver chip 202. The third edge 202C of the driver chip includes a first portion 602 and a second portion 604. The second subset of interconnects 402B access the first subset of intermediate pads 404C from the first portion 602. A plurality of input electronic pads 606 are formed on the driver chip 202 and adjacent to the bottom edge of the driver chip 202, thereby allowing the plurality of input electronic pads 606 to be located adjacent to a fan-in area 212 of the display screen 125.

It should be noted that details of a display fan-out scheme described with respect to each of FIGS. 4A-4B, 5A-5D, and 6 are also applicable to any other display fan-out schemes described with respect to other figures of FIGS. 4A-4B, 5A-5D, and 6 in an analogous manner. Each of the display fan-out schemes in FIGS. 4A-4B, 5A-5D, and 6 can be applied to route a subset of interconnects extending from the display area 204 to each of a subset or all of the plurality of driver chips 202 in FIG. 2B. Particularly, each of the plurality of driver chips 202 has a first edge 202A placed adjacent to the display area 204, one or more second edges 202B distinct from the first edge 202A, and a first row of electronic pads 404 proximate to the first edge 202A. The first row of electronic pads 404 has a first subset of end pads 404A at a first end of the first row, a second subset of end pads 404B at a second opposite end of the first row, and a first subset of intermediate pads 404C located between the first subset of end pads 404A and the second subset of end pads 404B. The first subset of end pads 404A physically contact a first subset of interconnects 402A from the first edge 202A, and the first subset of intermediate pads 404C physically contact a second subset of interconnects 402B from the one or more second edges 202B. By these means, the height of the fan-out area 210 is reduced not only by using multiple driver chips 202, but also by routing a subset of the interconnects from the one or more second edges 202B of the respective driver chip 202.

Figure 7A:
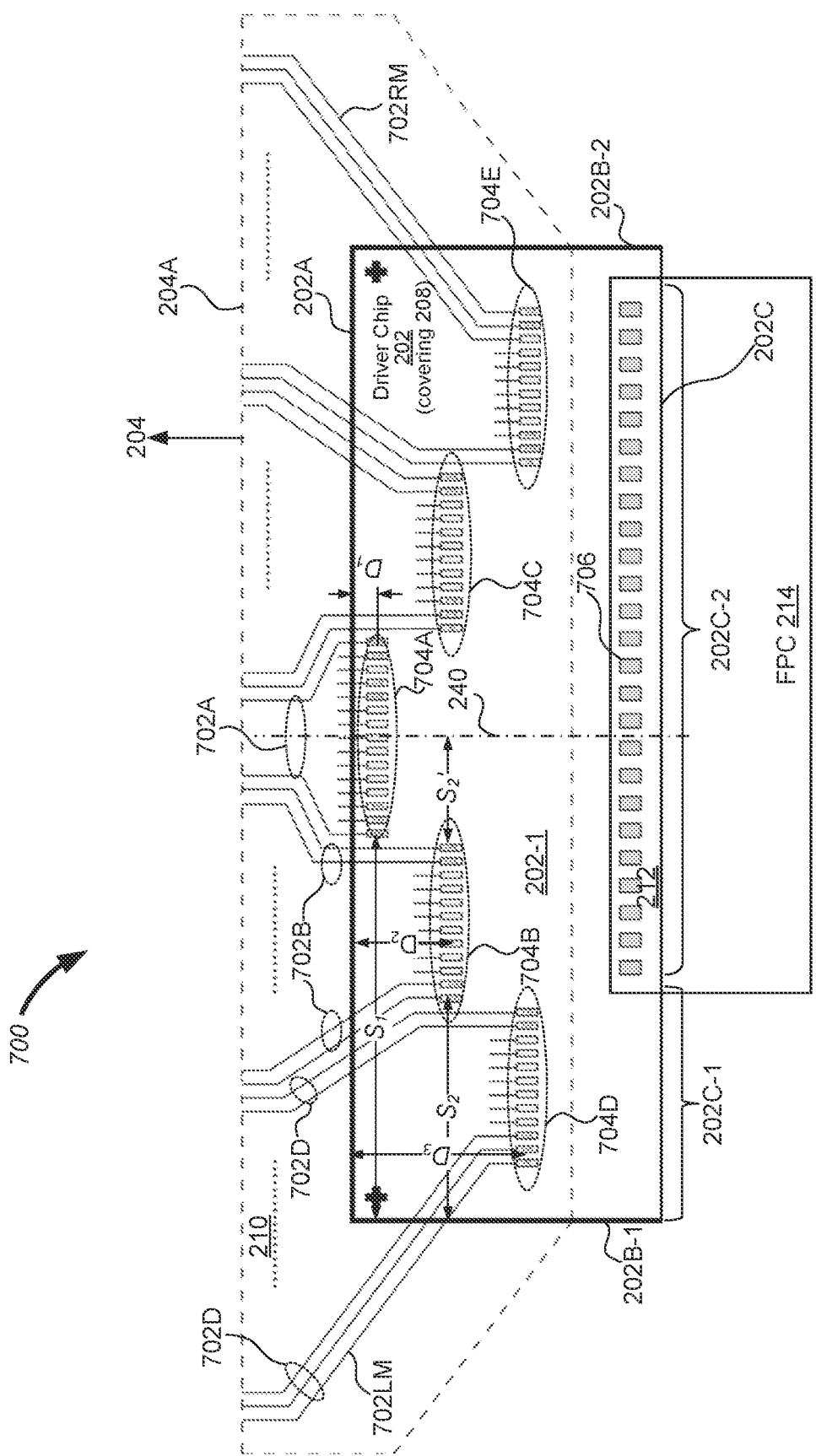

FIGS. 7A and 7B are two example bezel regions 700 and 750 of a display screen 125 in which interconnects 702 extending from a display area 204 contact a plurality of pad groups 704 of a driver chip 202 having different distances from the display area 204, in accordance with some embodiments. Each of the bezel regions 700 and 750 is immediately adjacent to a display area 204, and includes a fan-out area 210 and a driver area 208 that is covered by the driver chip 202. The driver chip 202 is disposed on the driver area 208 such that the first edge 202A of the driver chip 202 is adjacent to the display area 204, The first edge 202A faces a display edge 204A of the display area 204 and is closer to the display area 204 than any other edges of the driver chip 202 (e.g., a first side edge 202B-1, a second side edge 202B-2, and a third edge 202C). In some embodiments, the first edge 202A of the driver chip 202 is substantially parallel to the display edge 204A of the display area 204. The plurality of interconnects 702 of the display screen 125 extend from the display edge 204A of the display area 204 to the driver area 208. The driver chip 202 is flip-chip disposed onto the driver area 208 of a display substrate, thereby facilitating the plurality of interconnects 702 to reach and form electrical contacts with the pad groups 704 of the driver chip 202. As explained above, the display screen 125 can be used in a laptop display, a tablet computer display, or a mobile phone display, and the driver chip 202 includes at least a plurality of source drivers 222 configured to drive a plurality of display elements. In some embodiments, the driver chip 202 includes a timing controller 220 configured to control driving of the plurality of display elements of the display screen 125 in a synchronous manner by way of the interconnects 702 and pad groups 704. It is noted that in some embodiments, all of the plurality of interconnects 702 are formed on a single layer of conductive material, cannot cross each other, and are spatially ordered on the display substrate.

Each of the plurality of pad groups 704 (e.g., 704A, 704B, 704C, 704D, and 704E) includes at least one respective row of electronic pads that is arranged substantially in parallel with the first edge 202A of the driver chip 202 and electrically coupled to a respective subset of display elements (not shown) via a respective subset of interconnects 702 routed on a respective region of the fan-out area 210. The plurality of pad groups 704 includes at least a first pad group 704A and a second pad group 704B, and the first and second pad groups have two different distances Di and D2 from the first edge 202A and correspond to two different subsets of interconnects 702A and 702B routed on two non-overlapping regions of the fan-out area 210. Further, in some embodiments, the plurality of pad groups 704 includes a third pad group 704C. The third pad group 704C and second pad group 704B are symmetric with respect to a central axis 240 of the driver chip 202. The central axis 240 is perpendicular to the first edge 202A and configured to divide the driver chip 202 into two equal halves. The second and third pad groups 704B and 704C have the same distance D2 from the first edge 202A. Further, in some embodiments, the central axis 240 crosses the first pad group 704A, and the first pad group 704A is symmetric with respect to the central axis 240 of the driver chip 202.

In some embodiments, for each pad group 704, the electronic pads have a predefined pad size and are arranged in the respective row according to a pad pitch. A respective lateral shift S is optionally measured from a side edge 202B to an electronic pad that is closest to the side edge 202B among the electronic pads in the respective pad group 704. The first and second pad groups 704A and 704B have two distinct lateral shifts $S_1$ and $S_2$ from either one of the two side edges 202B of the driver chip 202 connecting to the first edge 202A. For example, the first pad group 704A has a first lateral shift $S_1$ from the side edge 202B and a first distance $D_1$ from the first edge 202A, and the second pad group 704B has a second lateral shift $S_2$ from the side edge 202B and a second distance $D_2$ from the first edge 202A. The first lateral shift $S_1$ is greater than the second lateral shift $S_2$, and the first distance $D_1$ is less the second distance $D_2$. In another example not shown in FIG. 7A, the first lateral shift $S_1$ is greater than the second lateral shift $S_2$, and the first distance $D_1$ is also greater than the second distance $D_2$. In some situations, projections of the first and second pad groups 704A and 704B to the first edge 202A of the driver chip 202 do not overlap. Stated another way, all electronic pads of the second pad group 704B are closer to a side edge 202B-1 than any of the electronic pads of the first pad group 704A. That is, an electronic pad that is furthest from a side edge 202B-1 among the electronic pads in the second pad group 704B is closer to the side edge 202B-1 than an electronic pad that is closest to the side edge 202B-1 among the electronic pads in the first pad group 704A.

The respective row of electronic pads of the first pad group 704A is coupled to a first subset of interconnects 702A, and the respective row of electronic pads of the second pad group 704B is coupled to a second subset of interconnects 702B. In some embodiments, each of the first subset of interconnects 702A at least partially has a respective serpentine shape and has a respective length that matches that of the second subset of interconnects 702B. Alternatively, in some embodiments, the driver chip 202 includes an interconnect compensation component configured to generate electrical signals that compensate for parasitics of one or more interconnects of the plurality of interconnects 702 actively.

In some embodiments, the plurality of pad groups 704 include three or more pad groups 704. The driver chip 202 has a central axis 240 that is perpendicular to the first edge 202A and configured to divide the driver chip to two equal halves including a first half 202-1. Each pad group 704A, 704B, or 704D that is partially or entirely formed on the first half 202-1 of the driver chip 202 has a respective lateral shift S' from the central axis 240, and a respective distance D from the first edge 202A. On the first half of each pad group (e.g., 704B), the respective distance (e.g., $D_2$) from the first edge 202A is distinct from that of any other pad group, and the respective lateral shift (e.g., $S_2'$) from the central axis 240 is distinct from that of any other pad group.

In some embodiments, for the plurality of pad groups 704, the respective distance D from the first edge 202A of each pad group 704 increases with the respective lateral shift S' from the central axis 240. Referring to FIG. 2A, given the minimum feature size (MS) and minimal titling angle (TA) of interconnects 702, a set 702LM of leftmost interconnects and a set 702RM of rightmost interconnects come into contact with a portion of the driver chip 202 that has a distance $D_3$ from the first edge 202A. As such, the driver chip 202 is moved closer to the display edge 204A of the display area 204 by a distance equal to $D_3$-$D_1$, and a width of the fanout area 210 is therefore reduced by the distance of $D_3$-$D_1$. In an example, this distance of $D_3$-$D_1$ is equal to 0.8 millimeters, and the fanout area is reduced by approximately 10%.

In some embodiments, a furthest pad group 704D of the plurality of pad groups 704 is disposed adjacent to a second edge 202B-1 (also called a side edge) connecting to the first edge 202A and a third edge 202C opposing the first edge 202A. One or more interconnects 702LM of the subset of interconnects 702D associated with the furthest pad group 704D access the row of electronic pads of the furthest pad group 704D from the second edge 202B-1. In some embodiments, the fan-out area 210 at least partially surrounds the driver area 208 where the driver chip 202 is disposed. Additionally, a plurality of input electronic pads 706 are formed on the driver chip 202 and adjacent to the third edge 202C (also called a bottom edge) of the driver chip 202, thereby allowing the plurality of input electronic pads 706 to be located adjacent to a fan-in area 212 of the display screen 125. In some embodiments not shown in FIG. 7A, a subset of input electronic pads 706 are disposed between the furthest pad group 704D and the third edge 202C. Alternatively, in some embodiments, there are no input electronic pads 706 disposed between the furthest pad group 704D and the third edge 202C. Stated another way, the driver chip 202 includes the third edge 202C that opposes and is parallel to the first edge 202A. The third edge 202C includes a first portion 202C-1 and a second portion 202C-2. The plurality of pad groups 704 include a pad group 704D located immediately adjacent to the first portion 202C-1 of the third edge 202C. The second portion 202C-2 includes a plurality of input electronic pads 706 and is adjacent to a fan-in area 212 of the display substrate. A flexible printed circuit (FPC) 214 is disposed on the fan-in area 212 to provide one or more input signals to the driver chip 202.

In some embodiments, the plurality of interconnects 702 are spatially arranged according to a first order, and the respective row of electronic pads of each pad group 704 is spatially arranged according a second order that is consistent with the first order. The first and second orders are observed along a direction parallel with the first edge 202A. The driver chip 202 is flip-chip assembled to the display substrate, thereby facilitating the respective row of electronic pads of each pad group 704 to physically contact the subset of interconnects 702 corresponding to the respective pad group 704.

In some embodiments, each of the plurality of pad groups 704 includes a respective number of electronic pads, and every two pad groups 704 optionally have the same or distinct numbers of electronic pads, while each pad group 702 has a respective distance D from the first edge 202A and a respective lateral shift S' from the central axis 240. For example, the plurality of pad groups 704 is divided from a single row of electronic pads (e.g., the pads 404 in FIG. 4A, having a distance of $D_1$ from the first edge 202A). Except the first pad group 704A, each pad group 704 is moved in parallel with the central axis 240 to the respective distance from the first edge 202A. The further away from the central axis 240 a pad group 704, the larger the respective lateral shift is, thereby allowing the drive chip 202 to be closer to the display edge 204A and allowing the fan-out area 210 to be reduced.

Referring to FIG. 7B, in some embodiments, each pad group 704 includes two rows of electronic pads, including a respective first row of electronic pads and a respective second row of electronic pads arranged immediately adjacent to the respective first row. For each pad group, the respective second row of electronic pads is arranged substantially in parallel with the first edge 202A of the driver chip 202 and electrically coupled to another respective subset of display elements (not shown) via another respective subset of interconnects 702 routed on the same respective region of the fan-out area 210. The fan-out area 210 supports the respective subset of interconnects 702 connecting to the respective first row of electronic pads. For each pad group 704, the interconnects coupled to the first and second rows of electronic pads are interleaved with each other in the same respective region of the fan-out area 210. In some embodiments, the first and second rows of a pad group 704 have the same number of electronic pads and are aligned to each other. One or more of the interconnects connecting to the second row are routed around electronic pads of the first row. Alternatively, in some embodiments, for each pad group 704, the respective second row of electronic pads is shifted with respect to the respective first row of electronic pads by a portion of a pad pitch of the respective first rows of electronic pads along a first direction that is parallel with the first edge 202A, allowing the interconnects connecting to the second row to pass between the electronic pads of the first row directly without routing around the electronic pads of the first row. In some embodiments, for each pad group 704, the respective first and second rows of electronic pads have the same pad size, the same pad pitch, and the same number of electronic pads, independently of whether the two rows of electronic pads are aligned or not.

From a different perspective, for each pad group 704, the respective first row of electronic pads and the respective second row of electronic pads have two lateral shifts S' from the central axis 240. The two lateral shifts S' are substantially identical (e.g., less than a predetermined shift tolerance, which is equal to three times of a pad pitch). The respective first row of electronic pads and the respective second row of electronic pads also have two different distances D from the first edge 204A. The difference of the two distances D is flexible based on whether the first and second rows of the respective pad group 704 are disposed close to or far away from each other.

In some embodiments not shown in FIGS. 7A and 7B, each pad group 704 includes three or more rows of electronic pads. The respective pad group 704 includes one or more respective third rows of electronic pads. Each respective third row of electronic pads is arranged substantially in parallel with the first edge 202A, adjacent to the respective second row of electronic pads, and electrically coupled to a respective third subset of display elements via a respective third subset of interconnects routed on the corresponding region of the fan-out area 210. This also supports the respective subsets of interconnects 702 connecting to the respective first and second rows of electronic pads. The interconnects coupled to the first, second, and third rows of electronic pads are interleaved with each other on the same region of the fan-out area 210. Within each pad group 704, the three or more rows of electronic pads are optionally aligned or shifted with respect to each other. In some embodiments, for each pad group 704, the respective three or more rows of electronic pads have the same pad size, the same pad pitch, and the same number of electronic pads.

It should be noted that details of each of the display fan-out schemes in FIGS. 7A and 7B can be applied to route a subset of interconnects extending from the display area 204 to each of a subset or all of the plurality of driver chips 202 in FIG. 2B. Particularly, each of the plurality of driver chips 202 has a first edge 202A placed adjacent to the display area 204, second edges 202B (e.g., side edges) connecting to the first edge 202A, a third edge 202C opposing the first edge 202A, and a plurality of pad groups 704 each having one or more rows of closely spaced electronic pads. For each driver chip 202, each pad group has a distinct distance from the first edge 202A from any other pad group on the same half of the driver chip 202. For example, the plurality of pad groups 704 includes a first pad group 704A and a second pad group 704B, and the first and second pad groups 704A and 704B have two different distances Di and D2 from the first edge 202A and correspond to two different subsets of interconnects 702A and 702B routed on two non-overlapping regions of the fan-out area 210 of each driver chip 202. In an example, the first pad group 704A is proximate to the first edge 202A, while the second pad group 704B is proximate to the third edge 202C opposing to the first edge 202A. By these means, the height of the fan-out area 210 is reduced not only by using multiple driver chips 202, but also by routing a subset of the interconnects to a plurality of pad groups 704 having different distances from the first edge 202A of each driver chip 202.

Referring to FIG. 2B, in some embodiments, two identical driver chips, a first driver chip 202-1 and a second driver chip 202-2, are disposed in the driver area 208. The first edges 202A (see FIG. 2A) of the first and second driver chips 202-1 and 202-2 are aligned and arranged in parallel with the display edge 204A of the display area 204. Further, in some embodiments, one or more third driver chips 202-3 that are identical to the first driver chip 202-1 are disposed in the driver area, and the first edges 202A of the first, second and third driver chips 202-1, 202-2, and 202-3 are aligned and arranged in parallel with the display edge 204A of the display area 204. In some embodiments, the first, second, and third driver chips are equally spaced (e.g., every two adjacent driver chips are separated by a predefined separation). In some embodiments, each of the first, second, and third driver chips 202 adopts a first pad arrangement scheme shown in FIGS. 4A-4B, 5A, and 6 or a second pad arrangement scheme shown in FIGS. 7A-7B, independently of the other driver chips 202. In some embodiments, all of the first, second, and third driver chips 202 adopts the same pad arrangement scheme selected from those described with reference to FIGS. 4A-4B, 5A, 6, and 7A-7B.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

It will also be understood that, although the terms first and second are used herein to describe various elements, these elements should not be limited by these terms. These terms are only used to distinguish one element from another. For example, a first fastener can be termed a second fastener, and, similarly, a second fastener can be termed a first fastener, without departing from the scope of the various described embodiments. The first fastener and the second fastener are both fasteners, but they are not the same fastener.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, steps, operations, elements, components, structures and/or groups, but do not preclude the presence or addition of one or more other features, steps, operations, elements, components, structures, and/or groups thereof.

As used herein, the term "if" means "when" or "upon" or "in response to determining" or "in response to detecting" or "in accordance with a determination that," depending on the context. Similarly, the phrase "if it is determined" or "if [a stated condition or event] is detected" means "upon determining" or "in response to determining" or "upon detecting [the stated condition or event]" or "in response to detecting [the stated condition or event]" or "in accordance with a determination that [a stated condition or event] is detected," depending on the context.

What is claimed is:

1. An electronic device, comprising:
a display substrate including a display area, a driver area, and a fan-out area, the fan-out area having a plurality of interconnects configured to provide electrical accesses to a plurality of display elements of the display area; and
a driver chip disposed on the driver area of the display substrate, the driver chip further including:
a first edge adjacent to the display area; and
a plurality of pad groups, each pad group including a respective row of electronic pads that is (i) arranged substantially in parallel with the first edge and (ii) electrically coupled to a respective subset of display elements via a respective subset of interconnects routed on a respective region of the fan-out area;
wherein the plurality of pad groups includes a first pad group and a second pad group, and the first and second pad groups have two different distances from the first edge and correspond to two different subsets of interconnects routed on two non-overlapping regions of the fan-out area;
wherein the driver chip has a side edge connecting to the first edge, the first pad group having a first shift from the side edge and a first distance from the first edge, the second pad group having a second shift from the side edge and a second distance from the first edge; and
wherein the first shift is greater than the second shift, and the first distance is less the second distance.

2. The electronic device of claim 1, wherein the driver chip is disposed such that the first edge is substantially parallel with a display edge of the display area.

3. The electronic device of claim 1, wherein:
the plurality of pad groups includes a third pad group;
the third pad group and the second pad group are symmetric with respect to a central axis of the driver chip that is perpendicular to the first edge and configured to divide the driver chip to two equal halves; and
the second and third pad groups have the same distance from the first edge.

4. The electronic device of claim 3, wherein the central axis of the driver chip crosses the first pad group, and the first pad group is symmetric with respect to the central axis of the driver chip.

5. The electronic device of claim 1, wherein the respective row of electronic pads of the first pad group is coupled to a first subset of interconnects, and the respective row of electronic pads of the second pad group is coupled to a second subset of interconnects, and wherein each of the first subset of interconnects at least partially has a respective serpentine shape and has a respective length that matches that of the second subset of interconnects.

6. The electronic device of claim 1, wherein the plurality of interconnects are formed on a single layer of conductive material, cannot cross each other, and are spatially ordered on the display substrate, and the fan-out area at least partially surrounding the driver area.

7. The electronic device of claim 1, wherein the driver chip includes an interconnect compensation component configured to generate electrical signals that compensate for parasitics of one or more interconnects of the plurality of interconnects actively.

8. The electronic device of claim 1, wherein:
the driver chip includes a third edge that opposes the first edge;
the display substrate further includes a fan-in area disposed adjacent to the third edge; and
flexible printed circuit (FPC) is disposed on the fan-in area to provide one or more input signals to the driver chip.

9. An electronic device comprising:
a display substrate including a display area, a driver area, and a fan-out area, the fan-out area having a plurality of interconnects configured to provide electrical accesses to a plurality of display elements of the display area; and
a driver chip disposed on the driver area of the display substrate, the driver chip further including:
a first edge adjacent to the display area; and
a plurality of pad groups, each pad group including a respective row of electronic pads that is (i) arranged substantially in parallel with the first edge and (ii) electrically coupled to a respective subset of display elements via a respective subset of interconnects routed on a respective region of the fan-out area;
wherein the plurality of pad groups includes a first pad group and a second pad group, and the first and second pad groups have two different distances from the first edge and correspond to two different subsets of interconnects routed on two non-overlapping regions of the fan-out area; and wherein for each pad group:
the respective row of electronic pads includes a respective first row of electronic pads;
the respective pad group includes a respective second row of electronic pads; and
the respective second row of electronic pads is arranged substantially in parallel with the first edge, immediately adjacent to the respective first row of electronic pads, and electrically coupled to another respective subset of display elements via another respective subset of interconnects routed on the respective region of the fan-out area.

10. The electronic device of claim 9, wherein for each pad group, the respective second row of electronic pads is shifted with respect to the respective first row of electronic pads by a portion of a pad pitch of the respective first rows of electronic pads along a first direction that is parallel with the first edge.

11. The electronic device of claim 9, wherein for each pad group, the respective first and second rows of electronic pads have the same pad size, the same pad pitch, and the same number of electronic pads.

12. The electronic device of claim 9, wherein for each pad group:
the respective pad group includes one or more respective third rows of electronic pads; and
each respective third row of electronic pads is arranged substantially in parallel with the first edge, immediately adjacent to the respective second row of electronic pads, and electrically coupled to a respective third subset of display elements via a respective third subset of interconnects routed on the corresponding region of the fan-out area.

13. The electronic device of claim 9, wherein:
the driver chip has a side edge connecting to the first edge;
the first pad group has a first shift from the side edge and a first distance from the first edge, and the second pad group has a second shift from the side edge and a second distance from the first edge; and
the first shift is greater than the second shift, and the first distance is less the second distance.

14. The electronic device of claim 9, wherein:
the driver chip has a central axis that is perpendicular to the first edge and configured to divide the driver chip to two equal halves including a first half;
each pad group that is partially or entirely formed on the first half of the driver chip has a respective lateral shift from the central axis, and a respective distance from the first edge; and
for each pad group, the respective distance from the first edge is distinct from that of any other pad group, and the respective lateral shift from the central axis is distinct from that of any other pad group.

15. The electronic device of claim 14, wherein for the plurality of pad groups, the respective distance from the first edge of each pad group increases with the respective lateral shift from the central axis.

16. The electronic device of claim 15, wherein a furthest pad group of the plurality of pad groups is disposed adjacent to a second edge connecting to the first edge and a third edge opposing the first edge, and one or more interconnects associated with the furthest pad group access the respective row of electronic pads of the furthest pad group from the second edge.

17. The electronic device of claim 9, the driver chip including a first driver chip, the electronic device further comprising one or more of:

a second driver chip that is identical to the first driver chip and disposed in the driver area, wherein the first edges of the first and second driver chips are aligned and arranged in parallel with a display edge of the display area; and one or more third driver chips that are identical to the first driver chip and disposed in the driver area, wherein the first edges of the first, second and third driver chips are aligned and arranged in parallel with the display edge of the display area, and the first, second, and third driver chips are equally spaced.

18. An electronic device comprising:

a display substrate including a display area, a driver area, and a fan-out area, the fan-out area having a plurality of interconnects configured to provide electrical accesses to a plurality of display elements of the display area; and a driver chip disposed on the driver area of the display substrate, the driver chip further including:

a first edge adjacent to the display area; and a plurality of pad groups, each pad group including a respective row of electronic pads that is (i) arranged substantially in parallel with the first edge and (ii) electrically coupled to a respective subset of display elements via a respective subset of interconnects routed on a respective region of the fan-out area;

wherein the plurality of pad groups includes a first pad group and a second pad group, and the first and second pad groups have two different distances from the first edge and correspond to two different subsets of interconnects routed on two non-overlapping regions of the fan-out area;

wherein the driver chip includes a third edge that opposes and is parallel to the first edge, the third edge including a first portion and a second portion;

wherein the plurality of pad groups includes a third pad group located immediately adjacent to the first portion of the third edge; and wherein the second portion includes a plurality of input electronic pads and is adjacent to a fan-in area of the display substrate.

19. The electronic device of claim 18, wherein the plurality of interconnects is spatially arranged according to a first order, and the respective row of electronic pads of each pad group is spatially arranged according a second order that is consistent with the first order.

20. The electronic device of claim 18, wherein the driver chip is flip-chip assembled to the display substrate, thereby facilitating the respective row of electronic pads of each pad group to physically contact the subset of interconnects; and wherein the electronic device is one of a laptop display, a tablet computer display, and a mobile phone display, and the driver chip includes at least a source driver configured to drive the plurality of display elements and a timing controller configured to control driving of the plurality of display elements in a synchronous manner.

* * * * *